(12) United States Patent
Fujii et al.

(10) Patent No.: US 8,264,051 B2
(45) Date of Patent: *Sep. 11, 2012

(54) SEMICONDUCTOR DEVICE AND MANUFACTURING METHOD OF THE SAME

(75) Inventors: Tetsuo Fujii, Toyohashi (JP); Kazuhiko Sugiura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/036,319

(22) Filed: Feb. 28, 2011

(65) Prior Publication Data

US 2011/0147863 A1     Jun. 23, 2011

Related U.S. Application Data

(63) Continuation of application No. 12/213,711, filed on Jun. 24, 2008, now Pat. No. 7,968,958.

(30) Foreign Application Priority Data

Jul. 2, 2007   (JP) .................................. 2007-174028
Jan. 11, 2008   (JP) ..................................... 2008-4144

(51) Int. Cl.
*H01L 29/84* (2006.01)

(52) U.S. Cl. ........ 257/415; 257/417; 257/418; 257/419; 257/E23.324

(58) Field of Classification Search ........... 257/417–419
See application file for complete search history.

(56) References Cited

U.S. PATENT DOCUMENTS

| 5,461,916 | A | 10/1995 | Fujii et al. |
| 5,627,318 | A | 5/1997 | Fujii et al. |
| 5,753,536 | A | 5/1998 | Sugiyama et al. |
| 5,872,024 | A | 2/1999 | Fujii et al. |
| 5,992,233 | A | 11/1999 | Clark |
| 6,030,850 | A | 2/2000 | Kurle et al. |
| 6,067,858 | A | 5/2000 | Clark et al. |
| 6,227,050 | B1 | 5/2001 | Fujii et al. |
| 6,240,782 | B1 | 6/2001 | Kato et al. |
| 6,250,156 | B1 | 6/2001 | Seshia et al. |
| 6,296,779 | B1 | 10/2001 | Clark et al. |
| 6,405,592 | B1 | 6/2002 | Murari et al. |

(Continued)

FOREIGN PATENT DOCUMENTS

CN        1971924 A      5/2007

(Continued)

OTHER PUBLICATIONS

Office Action dated Jun. 2, 2009 from the Japan Patent Office in the corresponding JP Application No. 2008-004144 (and English translation).

(Continued)

*Primary Examiner* — Angel Roman
(74) *Attorney, Agent, or Firm* — Posz Law Group, PLC

(57) ABSTRACT

A semiconductor device includes: a sensor element having a plate shape with a surface and including a sensor structure disposed in a surface portion of the sensor element; and a plate-shaped cap element bonded to the surface of the sensor element. The cap element has a wiring pattern portion facing the sensor element. The wiring pattern portion connects an outer periphery of the surface of the sensor element and the sensor structure so that the sensor structure is electrically coupled with an external element via the outer periphery. The sensor element does not have a complicated multi-layered structure, so that the sensor element is simplified. Further, the dimensions of the device are reduced.

8 Claims, 29 Drawing Sheets

U.S. PATENT DOCUMENTS

| | | |
|---|---|---|
| 6,422,078 B2 | 7/2002 | Imai |
| 6,463,803 B2 | 10/2002 | Fujii et al. |
| 6,550,331 B2 | 4/2003 | Fujii et al. |
| 6,868,727 B2 | 3/2005 | Fujii et al. |
| 6,892,575 B2 | 5/2005 | Nasiri et al. |
| 6,938,486 B2 | 9/2005 | Fujii et al. |
| 6,979,873 B2 | 12/2005 | Fujii |
| 7,040,165 B2 | 5/2006 | Fujii et al. |
| 7,045,868 B2 | 5/2006 | Ding et al. |
| 7,104,129 B2 | 9/2006 | Nasiri et al. |
| 7,250,353 B2 | 7/2007 | Nasiri et al. |
| 2002/0017713 A1 | 2/2002 | Ruby et al. |
| 2002/0192855 A1 | 12/2002 | Nagoa |
| 2003/0183009 A1 | 10/2003 | An et al. |
| 2003/0183407 A1 | 10/2003 | Ma et al. |
| 2005/0205951 A1 | 9/2005 | Eskridge |
| 2006/0019421 A1 | 1/2006 | Jujii et al. |
| 2006/0055001 A1 | 3/2006 | Fujii |
| 2006/0105503 A1 | 5/2006 | Ding et al. |
| 2007/0132047 A1 | 6/2007 | Kuisma et al. |
| 2009/0152656 A1* | 6/2009 | Okudo et al. .......... 257/419 |

FOREIGN PATENT DOCUMENTS

| | | |
|---|---|---|
| JP | A-10-092702 | 4/1998 |
| JP | A-2001-348223 | 12/2001 |
| JP | A-2003-329704 | 11/2003 |
| JP | A-2003-344447 | 12/2003 |
| JP | A-2004-333133 | 11/2004 |
| KR | 2001057139 A | 7/2001 |

OTHER PUBLICATIONS

Office Action dated Dec. 4, 2009 issued in corresponding Chinese patent application No. 2008101284838 (English translation enclosed).

Office Action mailed Jun. 28, 2010 issued in corresponding parent U.S. Appl. No. 12/213,711.

Notice of Allowance mailed Dec. 15, 2010 issued in corresponding parent U.S. Appl. No. 12/213,711.

* cited by examiner

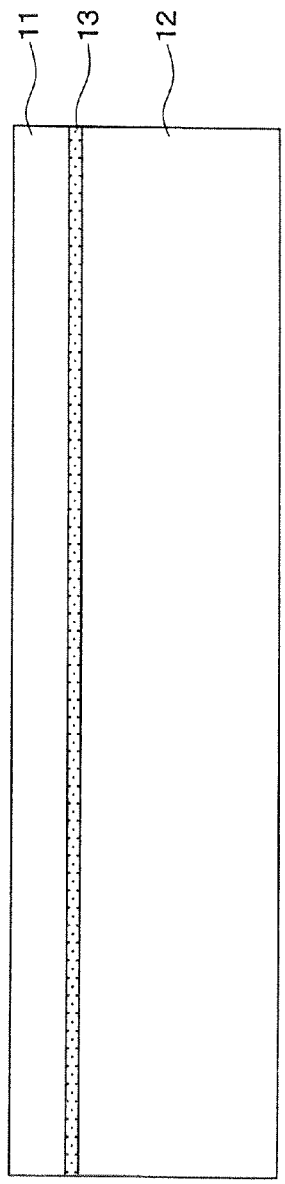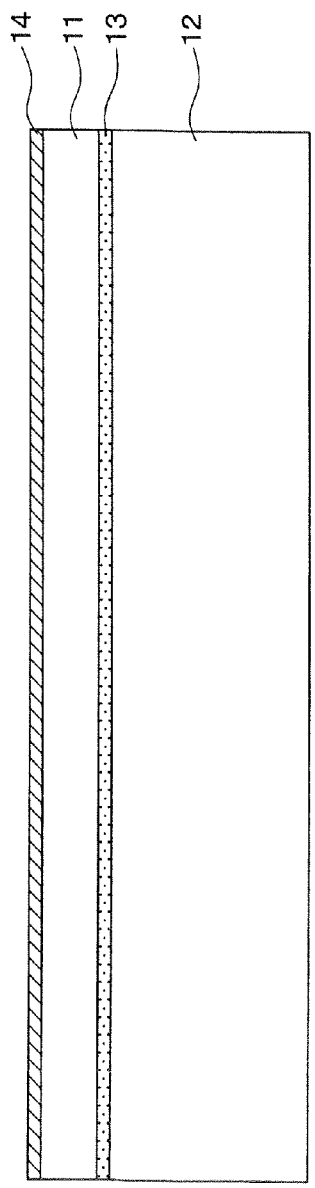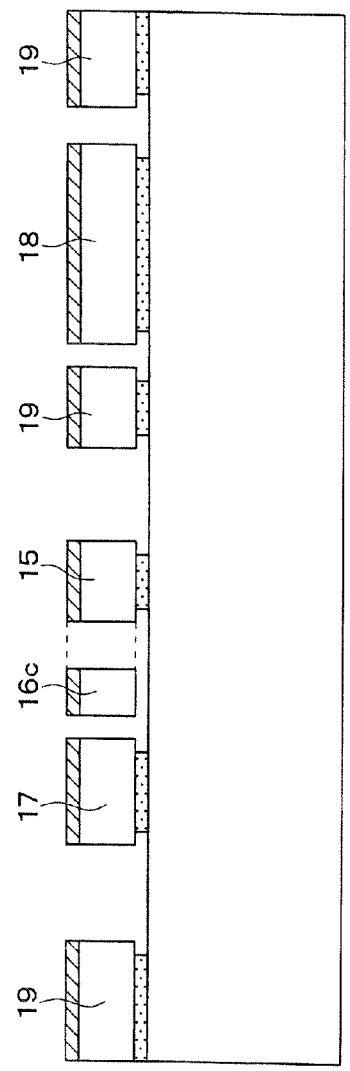
FIG. 4A
FIG. 4B
FIG. 4C

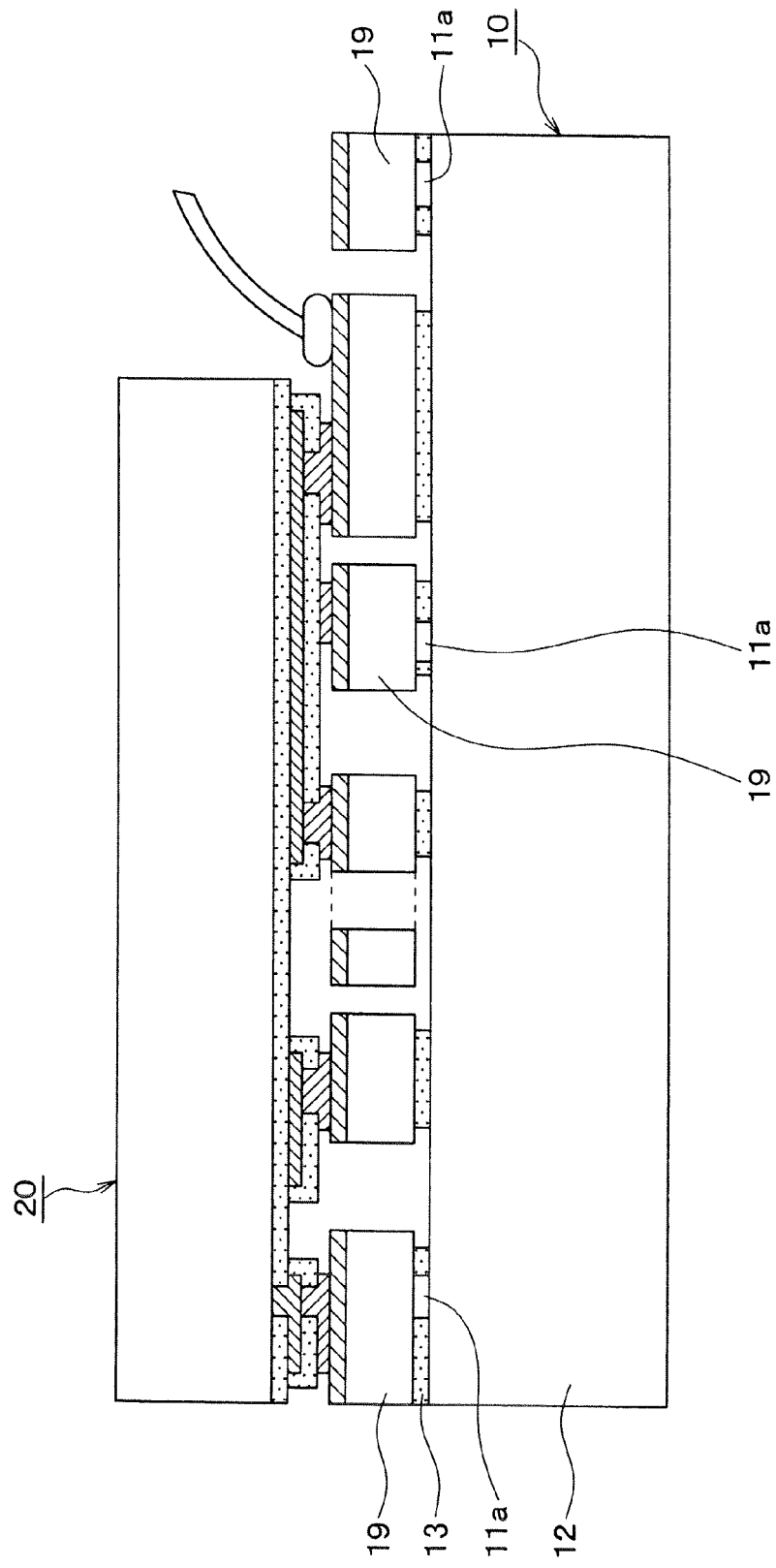

US 8,264,051 B2

SEMICONDUCTOR DEVICE AND MANUFACTURING METHOD OF THE SAME

CROSS REFERENCE TO RELATED APPLICATIONS

This application is a continuation of U.S. application Ser. No. 12/213,711 filed on Jun. 24, 2008, which is based on and claims priority to Japanese Patent Applications No. 2007-174028 filed on Jul. 2, 2007, and No. 2008-4144 filed on Jan. 11, 2008, the disclosures of which are incorporated herein by reference.

FIELD OF THE INVENTION

The present invention relates to a semiconductor device and a manufacturing method of a semiconductor device.

BACKGROUND OF THE INVENTION

Conventionally, a semiconductor dynamic quantity sensor has been proposed which has a movable portion with a beam-like structure and a fixed portion, and detects a dynamic quantity such as an acceleration, a yaw rate, vibration, or the like by detecting, e.g., a change in the capacitance between the movable portion and the fixed portion (see, e.g., Patent Documents 1 to 3). In each of Documents 1 to 3, a semiconductor dynamic quantity sensor is shown in which a movable portion with a beam-like structure and a fixed portion, each functioning as a sensing portion, are formed on a multilayer SOI substrate, and wiring connecting the individual portions is made of polysilicon or the like.

In Patent Document 4, a semiconductor dynamic quantity sensor is proposed which can prevent the entrance of water or a foreign substance into a movable portion by covering the movable portion with a cap member. In the semiconductor dynamic quantity sensor shown in Patent Document 4, the cap member is provided with a large number of through holes, and wire bonding is performed directly to wire bonding pads provided on an SOI substrate formed with the movable portion and a fixed portion, so that the wires are used as a replacement for a wiring layer.

In Patent Document 5, a semiconductor dynamic quantity sensor is proposed which has a structure obtained by laminating, on a silicon layer composing an SOI substrate and provided with a movable portion or the like, a silicon layer composing another SOI substrate and provided with a signal processing circuit via an annular bump. In Patent Document 6, another example of the annular bump is proposed. In a sensor having such a structure, a wiring layer is provided from a signal processing circuit to electrically connect the signal processing circuit and the outside, and the wiring layer is extracted crosswise to the outside of the annular bump, while it is insulated from the annular bump.

Patent Document 1: JP-H9-129898 A
Patent Document 2: JP-H11-295336 A
Patent Document 3: JP-H6-123628 A
Patent Document 4: JP-2004-333133 A
Patent Document 5: JP-2004-311951 A
Patent Document 6: JP-H11-94506 A However, each of the technologies described in Patent Documents 1 to 3 has the problem that, since the wiring layer made of a polysilicon layer is formed on the same substrate formed with the sensing portion, the manufacturing process is complicated, and the yield of the manufactured semiconductor dynamic quantity sensor lowers.

With the technology described in Patent Document 4, it is necessary to form the large number of holes extending through the cap member. Moreover, since the bonding wires are connected to the wire bonding pads using a bonding tool, the large-sized through holes should be formed to keep the tool from contact with the sidewall surfaces of the through holes. This leads to the problem that a semiconductor chip formed with the semiconductor dynamic quantity sensor has a large chip size.

With the technology described in Patent Document 5, since the wiring layer crosses the annular bump, the bump and the wiring layer should be isolated with an insulator layer to be electrically insulated from each other. This leads to the problem that the structure of the semiconductor dynamic quantity sensor is complicated.

Thus, it is required to simplify the structure of a sensor in a semiconductor device, and to reduce a chip size.

SUMMARY OF THE INVENTION

In view of the above-described problem, it is an object of the present disclosure to provide a semiconductor device. It is another object of the present disclosure to provide a manufacturing method of a semiconductor device.

According to a first aspect of the present disclosure, a semiconductor device includes: a sensor element having a plate shape with a surface and including a sensor structure disposed in a surface portion of the sensor element; and a plate-shaped cap element bonded to the surface of the sensor element. The cap element has a wiring pattern portion facing the sensor element; and the wiring pattern portion connects an outer periphery of the surface of the sensor element and the sensor structure so that the sensor structure is electrically coupled with an external element via the outer periphery.

In the above device, since the wiring pattern portion is disposed in the cap element, the sensor element does not have a complicated multi-layered structure. Thus, the structure of the sensor element is simplified. Further, the dimensions of the device are also reduced.

According to a second aspect of the present disclosure, a semiconductor device includes: a first chip having a plate shape with a first surface and including a first IC circuit portion, which is disposed in a first surface portion of the first chip; and a second chip having a plate shape with a second surface and including a second IC circuit portion, which is disposed in a second surface portion of the second chip. The first chip further includes a first wiring pattern portion comprising a first insulating film, a first wiring layer, a second insulating film and a second wiring layer. The first insulating film is disposed on the first IC circuit portion. The first wiring layer is patterned on the first insulating film and coupled with the first IC circuit portion. The second insulating film is disposed on the first wiring layer. The second insulating film has a first opening so that the first wiring layer is exposed from the second insulating film via the first opening. The second wiring layer is disposed on the first wiring layer exposed in the first opening. The second chip includes a second wiring pattern portion comprising a third insulating film, a third wiring layer, a fourth insulating film and a fourth wiring layer. The third insulating film is disposed on the second IC circuit portion. The third wiring layer is patterned on the third insulating film and coupled with the second IC circuit portion. The fourth insulating film is disposed on the third wiring layer. The fourth insulating film has a second opening so that the third wiring layer is exposed from the fourth insulating film via the second opening. The fourth wiring layer is disposed on the third wiring layer exposed from the second opening. The surface of the first chip faces the surface of the second chip. The second wiring layer of the first wiring pattern portion of the first chip and the fourth wiring layer of the second wiring pattern portion of the second chip are bonded to each other.

Each wiring pattern portion is disposed on a respective chip so that the wiring pattern portion is not disposed in a respective circuit portion. Accordingly, the structure of each circuit portion is simplified, and the dimensions of the device are also reduced.

According to a third aspect of the present disclosure, a method for manufacturing a semiconductor device includes: preparing a sensor element having a plate shape with a surface, and forming a sensor structure in a surface portion of the sensor element; preparing a plate-shaped cap element having a wiring pattern portion, and patterning the wiring pattern portion to bond with the sensor element in such a manner that an outer periphery of the surface of the sensor element is connected to the sensor structure with the wiring pattern portion; and bonding the cap element and the sensor element to connect the wiring pattern portion to the sensor structure.

In the above method, since the sensor structure is only disposed in the sensor element, the sensor element does not have a complicated wiring structure. Thus, a step for forming the sensor element is simplified. Further, since the wiring pattern portion is formed in the cap element, a step of forming the cap element is also simplified. Thus, the method for manufacturing the semiconductor device is simplified, and the yielding ratio of the device is improved.

According to a fourth aspect of the present disclosure, a method for manufacturing semiconductor devices includes: preparing a sensor wafer having a plurality of sensor elements, each of which has a plate shape with a surface, and forming a sensor structure in a surface portion of each sensor element; preparing a cap wafer having a plurality of plate-shaped cap elements, each of which has a wiring pattern portion to be bonded to a respective sensor element, and patterning each of the wiring pattern portions to connect an outer periphery of a respective sensor element and a respective sensor structure; bonding the sensor wafer and the cap wafer to connect each wiring pattern portion to a respective sensor structure; and dividing the cap wafer and the sensor wafer into a plurality of sensor chips.

In the above method, the step for forming the sensor element is simplified, and the step of forming the cap element is also simplified. Thus, the method for manufacturing the semiconductor device is simplified, and the yielding ratio of the device is improved. Further, multiple sensor chips are formed at the same time.

According to a fifth aspect of the present disclosure, a method for manufacturing a semiconductor device includes: preparing a first chip having a plate shape with a surface, forming a first IC circuit portion in a surface portion of the first chip, and forming a first wiring pattern portion on the first IC circuit portion, the first wiring pattern portion comprising a first insulating film, a first wiring layer, a second insulating film and a second wiring layer, wherein the first insulating film is formed on the first IC circuit portion, the first wiring layer is patterned on the first insulating film to be connected to the first IC circuit portion, the second insulating film is formed on the first wiring layer and has a first opening to expose the first wiring layer via the first opening, and the second wiring layer is formed on the first wiring layer exposed from the second insulating film via the opening; preparing a second chip having a plate shape with a surface, forming a second IC circuit portion in a surface portion of the second chip, and forming a second wiring pattern portion on the second IC circuit portion, the second wiring pattern portion comprising a third insulating film, a third wiring layer, a fourth insulating film and a fourth wiring layer, wherein the third insulating film is formed on the second IC circuit portion, the third wiring layer is patterned on the third insulating film to be connected to the second IC circuit portion, the fourth insulating film is formed on the third wiring layer and has a second opening to expose the third wiring layer via the second opening, and the fourth wiring layer is formed on the third wiring layer exposed from the fourth insulating film via the second opening; and facing the surface of the first chip and the surface of the second chip, and bonding the second wiring layer of the first wiring pattern portion of the first chip and the fourth wiring layer of the second wiring pattern portion of the second chip.

Each wiring pattern portion is disposed on a respective chip so that the wiring pattern portion is not disposed in a respective circuit portion. Accordingly, the structure of each circuit portion is simplified, and the dimensions of the device are also reduced. Further, the first chip is easily connected to the second chip. Thus, the manufacturing method of the device is simplified.

BRIEF DESCRIPTION OF THE DRAWINGS

The above and other objects, features and advantages of the present invention will become more apparent from the following detailed description made with reference to the accompanying drawings. In the drawings:

FIGS. 4A to 4C are cross-sectional views illustrating the steps of manufacturing the sensor portion of the semiconductor dynamic quantity sensor according to the first embodiment;

FIG. 16 is a schematic cross-sectional view of a semiconductor dynamic quantity sensor according to a tenth embodiment of the present invention;

DETAILED DESCRIPTION OF THE PREFERRED EMBODIMENTS

First Embodiment

Figure 1:
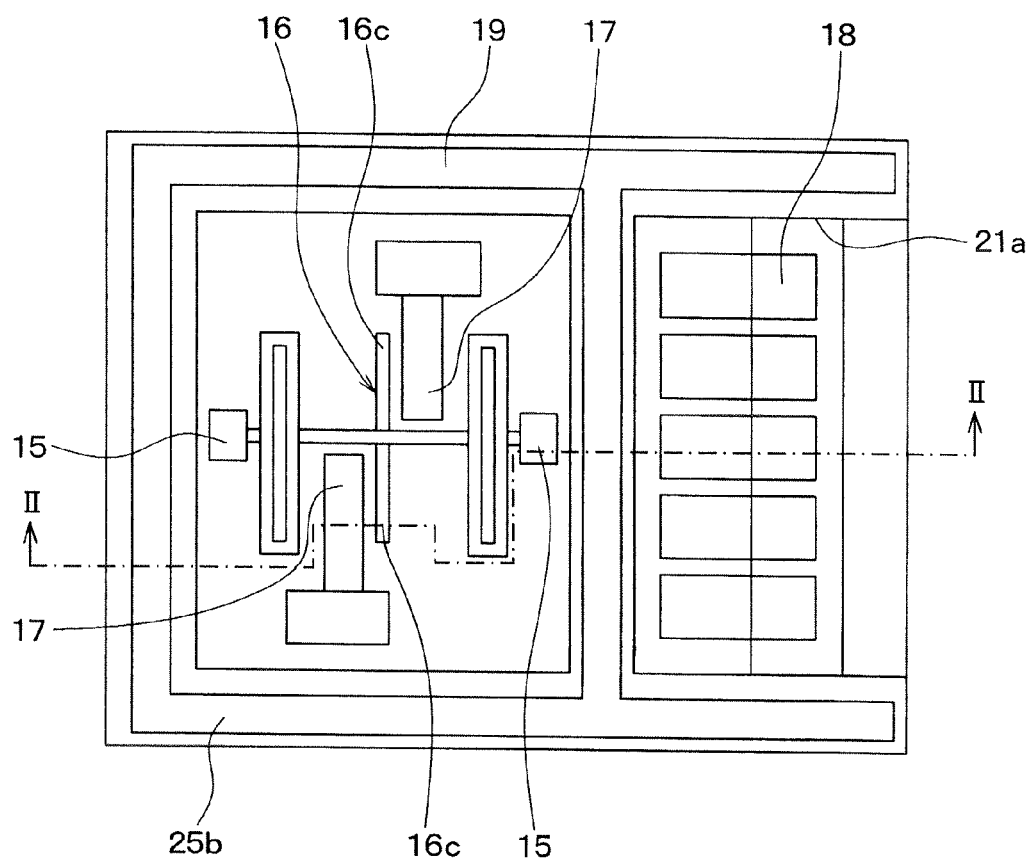
FIG. 1 is a plan view of a semiconductor dynamic quantity sensor according to a first embodiment of the present invention.

Referring now to the drawings, the first embodiment of the present invention will be described hereinbelow. A semiconductor dynamic quantity sensor as a semiconductor device shown below is a dynamic quantity sensor, such as an acceleration sensor or an angular velocity sensor (Gyro sensor) having a movable portion, which is used to detect, e.g., the acceleration or angular velocity of a vehicle. In the semiconductor device, an integrated circuit such as an IC or an LSI, a semiconductor dynamic quantity sensor (an acceleration sensor, an angular velocity sensor (Gyro sensor), or the like) having a movable portion, and a MEM oscillator are protected with a cap. The device is suitably used for an acceleration sensor or an angular velocity sensor (Gyro sensor).

Figure 2:
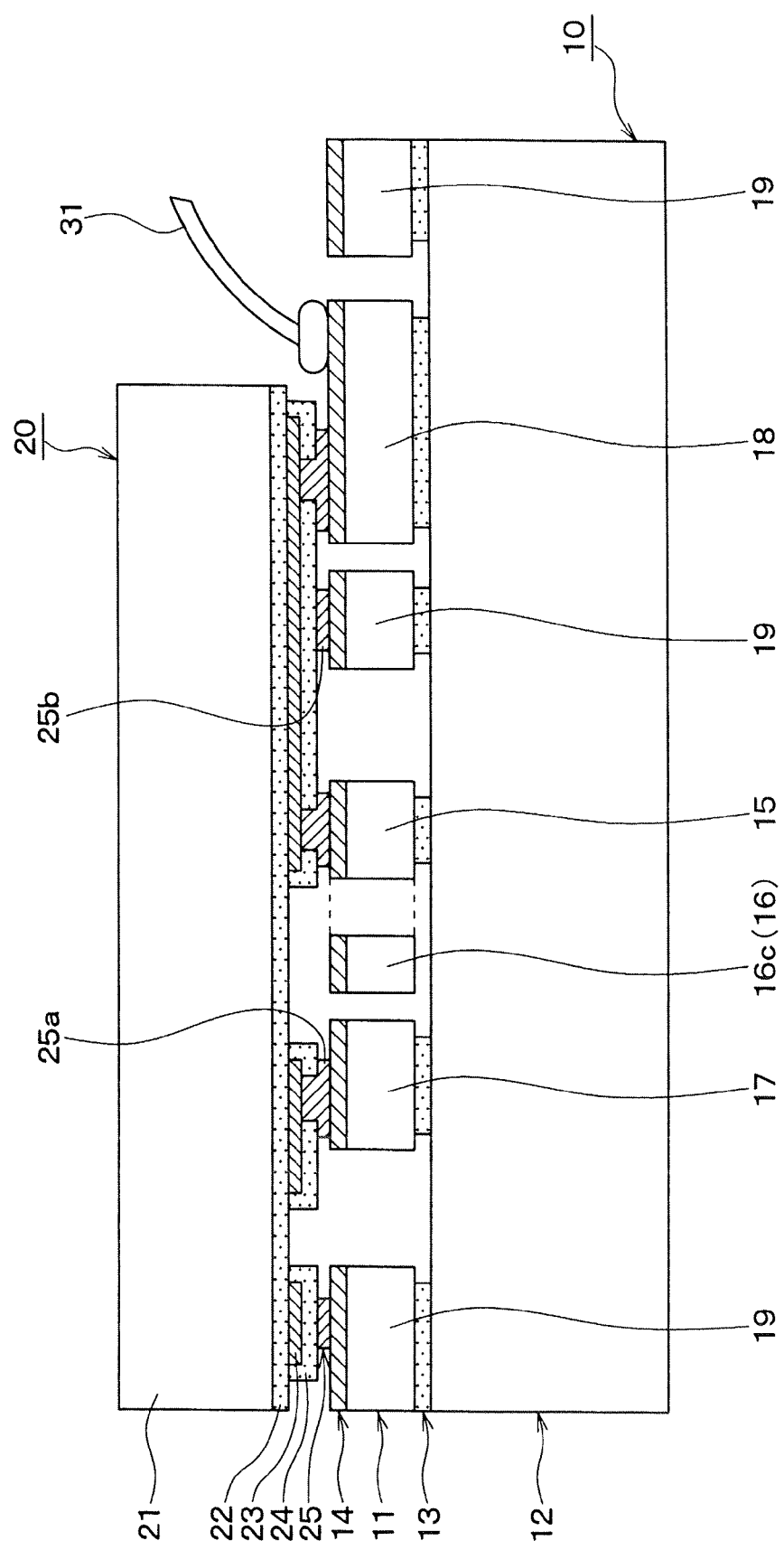
FIG. 2 is a cross-sectional view of the sensor shown in FIG. 1 along the line II-II.
Figure 3A:
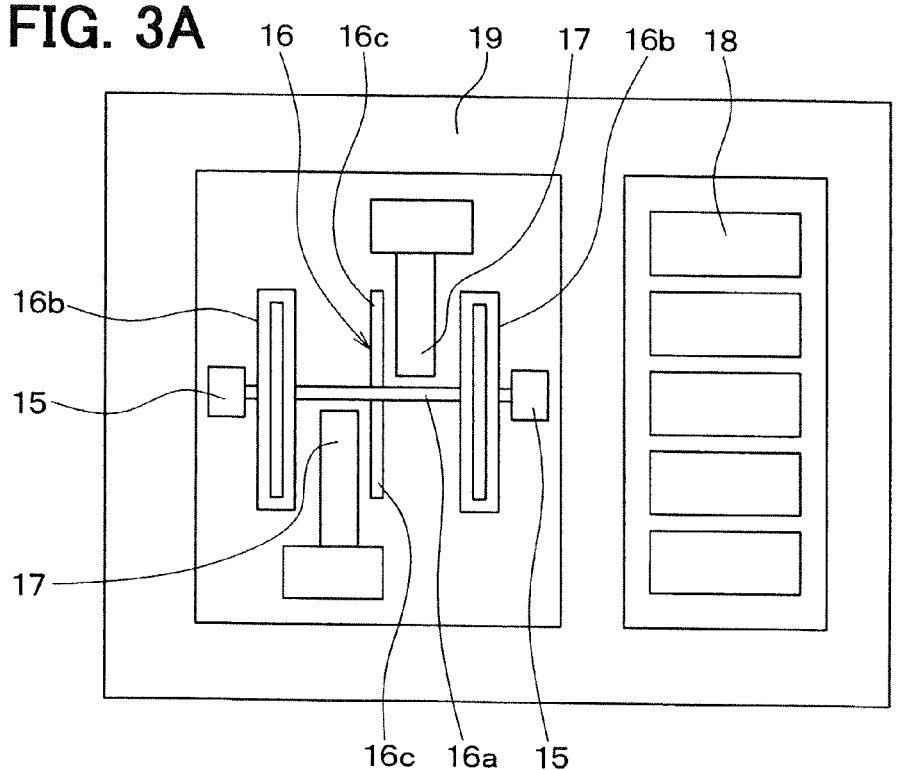
FIG. 3A is a plan view of a sensor portion.
Figure 3B:
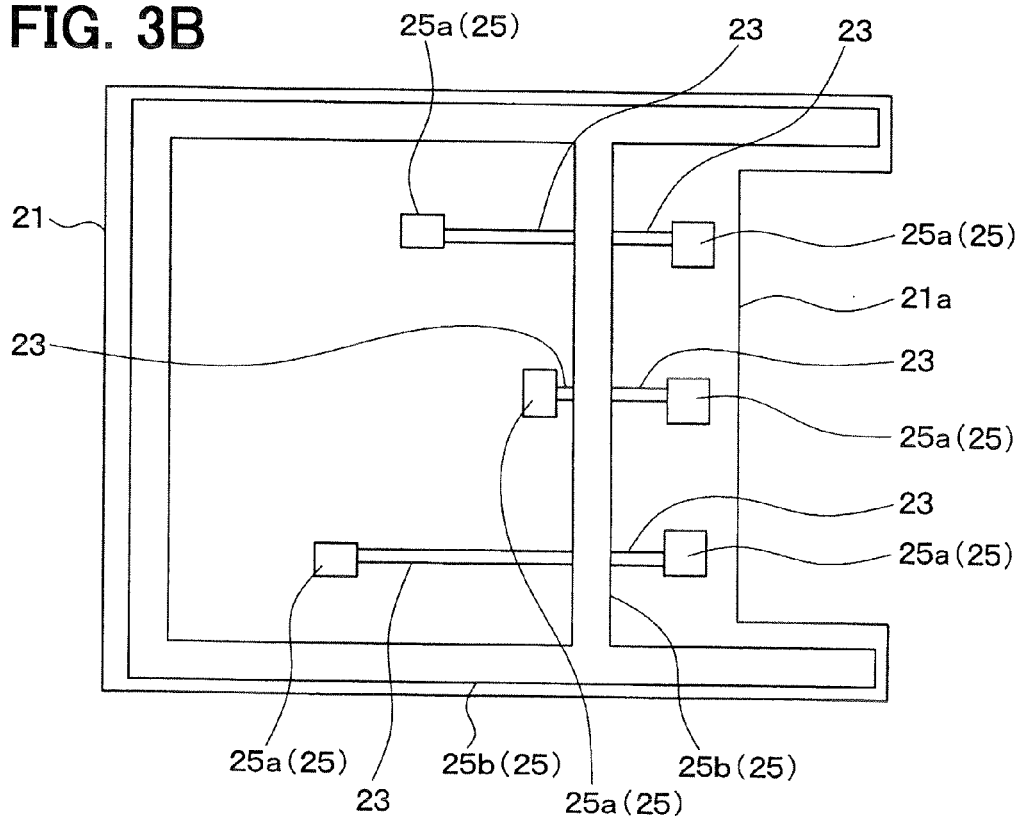
FIG. 3B is a plan view of a cap portion.

FIG. 1 is a plan view of a semiconductor dynamic quantity sensor according to the first embodiment. FIG. 2 is a cross-sectional view of the sensor 1 shown in FIG. 1 along the line II-II. FIG. 3A is a plan view of a sensor portion 10, and FIG. 3B is a plan view of a cap portion 20, each showing a plane in which the sensor portion 10 and the cap portion 20 oppose each other. In FIG. 3B, a first insulating film 22 and a second insulating film 24 are omitted. A description will be given hereinbelow of a structure of the semiconductor dynamic quantity sensor with reference to FIGS. 1 to 3.

As shown in FIG. 2, the semiconductor dynamic quantity sensor includes the plate-like sensor portion 10, and the plate-like cap portion 20 which are laminated on each other.

The sensor portion 10 is provided with a sensing portion for detecting a physical quantity such as an acceleration. The sensor portion 10 comprises an SOI substrate comprising a first silicon layer 11, a second silicon layer 12, and an insulating layer 13 interposed between the silicon layers 11 and 12, and a wiring layer 14 provided on the first silicon layer 11. For each of the silicon layers 11 and 12, e.g., N-type monocrystalline silicon is used. For the insulating layer 13, e.g., $SiO_2$ is used. For the wiring layer 14, e.g., Al is used.

The sensing portion is provided in a surface layer portion of a surface of the plate-like first silicon layer 11 having the surface and composing the SOI substrate. Specifically, as shown in FIG. 1, the first silicon layer 11 is formed with movable electrode fixing portions 15, a movable electrode portion 16, fixed electrode portions 17, a connection portion 18, and a peripheral portion 19.

The movable electrode fixing portions 15 are each in the shape of a block and provided at two positions on the insulating layer 13. The movable electrode portion 16 is disposed between these movable electrode fixing portions 15. As shown in FIG. 3A, the movable electrode portion 16 includes a linear part 16a connecting the movable electrode fixing portions 15, spring parts 16b each perpendicular to the linear part 16a, and a bar-shaped electrode part 16c. As a result of disposing the movable electrode 16 between the movable electrode fixing portions 15, the movable electrode 16 is in a state floating over the second silicon layer 12.

The bar-shaped fixed electrode portions 17 are disposed at positions each opposing the electrode part 16c of the movable electrode portion 16 on the insulating layer 13. Although the electrode part 16c and the fixed electrode portions 17 shown in the embodiment are each minimum in number, in an actual situation, a larger number of the electrode parts 16c and a larger number of the fixed electrode portions 17 are arranged in a comb-teeth configuration to compose a comb-teeth electrode, i.e., a capacitor.

With such a structure, when the semiconductor dynamic quantity sensor receives an acceleration (or an angular velocity) from the outside, the spring parts 16b of the movable electrode portion 16 contract so that the electrode part 16c of the movable electrode portion 16 moves relative to the fixed electrode portion 17 at the fixed position in the direction in which the linear part 16a of the movable electrode portion 16 extends. Therefore, by detecting the capacitance value of the capacitor comprising the fixed electrode portions 17 and the electrode part 16c, the acceleration or the angular velocity received by the semiconductor dynamic quantity sensor can be obtained. The movable electrode fixing portions 15, the movable electrode portion 16, and the fixed electrode portions 17 each composing the comb-teeth structure will be hereinafter referred to as sensor structures.

The connection portion 18 functions as a terminal for electrically connecting the semiconductor dynamic quantity sensor and the outside. As shown in FIG. 2, since the wiring layer 14 is provided on the first silicon layer 11, the semiconductor dynamic quantity sensor and the outside can be electrically connected via the wiring layer 14.

As shown in FIG. 3A, the peripheral portion 19 is provided to encircle the foregoing sensor structures once, and also encircle the connection portion 18 once. It will be easily appreciated that there is no operational problem even when the connection portion 18 is not completely encircled once. That is, the region provided with the sensor structures and the region provided with the connection portion 18 connecting to the outside are isolated by the peripheral portion 19.

On the other hand, the cap portion 20 prevents the entrance of water or a foreign substance into the sensor structures described above, and is comprised of a silicon substrate 21, a first insulating film 22, a first wiring layer 23, a second insulating film 24, and a second wiring layer 25. The first insulating film 22 and the second insulating film 24 may be made of either the same material or different materials. The same holds true for the first wiring layer 23 and the second wiring layer 25. The first wiring layer 23, the second insulating film 24, and the second wiring layer 25 correspond to wiring pattern portions.

The silicon substrate 21 has a recessed part 21a in which a side surface of a quadrilateral is recessed toward the other side surface thereof. The recessed part 21a exposes the connection portion 18 from the silicon substrate 21 when the cap portion 20 and the sensor portion 10 are superimposed on each other.

The first insulating film 22 is formed on the surface of the silicon substrate 21 opposing the sensor portion 10. The first insulating film 22 insulates the first wiring layer 23 and the silicon substrate 21 from each other. The first wiring layer 23 is patterned and provided on the first insulating film 22.

The second insulating film 24 is formed on the first wiring layer 23 so as to cover the first wiring layer 23. Of the second insulating film 24, the respective portions opposing the fixed electrode portions 17, the movable electrode fixing portions 15, and the connection portion 18 are opened.

The second wiring layer 25 is patterned and provided on the second insulating film 24 thus provided with the openings. That is, the second wiring layer 25 includes a wiring part 25a bonded to the fixed electrode portions 17, the movable electrode fixing portions 15, and the connection portion 18 of the sensor portion 10, and a hermetically sealing part 25b bonded to the peripheral portion 19 of the sensor portion 10. The hermetically sealing part 25b is provided to traverse the first wiring layer 23. In other words, the hermetically sealing part 25b is disposed to span over the first wiring layer 23.

In the second wiring layer 25 with such a wiring structure, the respective heights of the wiring part 25a and the hermetically sealing part 25b from the surface of the silicon substrate 21 are the same.

In the present embodiment, the recessed part 21a is provided in one side surface of the silicon substrate 21, so that the second wiring layer 25 corresponding to the peripheral portion 19 opposing the recessed part 21a is not provided. Accordingly, the second wiring layer 25 is provided to encircle the sensor structures of the sensor portion 10 at least once.

As described above, in the opened portions of the second insulating film 24, the first wiring layer 23 and the wiring part 25a of the second wiring layer 25 are electrically connected. On the other hand, in the unopened portion of the second insulating film 24; i.e., in the area of the second insulating film 24 opposing the peripheral portion 19, the hermetically sealing part 25b of the second wiring layer 25 is formed on the second insulating film 24, so that the first wiring layer 23 and the hermetically sealing part 25b are insulated. That is, it is possible to provide a wiring configuration in which the first wiring layer 23 and the hermetically sealing part 25b cross each other, and electrically connect the connection portion 18 and each of the fixed electrode portions 17 and the movable electrode fixing portions 15 of the sensor unit 10 across the peripheral portion 19.

For the first insulating film 22 and the second insulating film 24 each mentioned above, $SiO_2$ or $Si_3N_4$, e.g., is used. For the first wiring layer 23 and the second wiring layer 25, Al or polysilicon, e.g., is used.

Then, the second wiring layer 25 of the cap portion 20 is solidly bonded to the peripheral portion 19 of the sensor portion 10 by a method such as, e.g., direct bonding. As a result, a configuration as shown in FIG. 2 is provided in which the sensor structures are hermetically sealed by the second silicon layer 12, the insulating layer 13, and the peripheral portion 19 of the sensor unit 10 and by the second wiring layer 25, the hermetically sealing part 25b of the second wiring layer 25, the second insulating film 24, and the first insulating film 22 of the cap portion 20.

That is, by sealing the sensor structures, it is possible to prevent the entrance of water or a foreign substance into the sealed space. There are cases where the space is evacuated and where the space contains an inert gas such as $N_2$ or He, or an atmosphere. In the present embodiment, the space is in vacuum.

Additionally, as shown in FIG. 1, the recessed part 21a provided in the silicon substrate 21 of the cap portion 20 exposes the connection portion 18 of the sensor portion 10 from the silicon substrate 21. To the connection portion 18 exposed from the silicon substrate 21, bonding wires 31 are bonded, as shown in FIG. 2, to electrically connect the semiconductor dynamic quantity sensor to the outside. The foregoing is the description of the overall structure of the semiconductor dynamic quantity sensor according to the present embodiment.

Next, a description will be given of a method for manufacturing the semiconductor dynamic quantity sensor described above. It is assumed hereinbelow that a plurality of the sensor portions 10 are formed on a single silicon wafer. FIGS. 4A to 4C are cross-sectional views illustrating the steps of manufacturing the sensor portions 10 of the semiconductor dynamic quantity sensor according to the present embodiment.

First, in the step shown in FIG. 4A, an SOI substrate is prepared. Specifically, using a monocrystalline silicon wafer as the second silicon layer 12 as a supporting base, a $SiO_2$ film with a thickness ranging from 0.1 to 2 μm is formed as the insulating layer 13 on the supporting base. Further, a silicon layer as the first silicon layer 11 is bonded onto the $SiO_2$ film by a wafer bonding method, whereby the SOI substrate is prepared.

In the present embodiment, an N-type (100) silicon layer having a specific resistance ranging from, e.g., 0.001 Ω·cm to 0.02 Ω·cm is used as the first silicon layer 11. As the second silicon layer 12, an N-type (100) silicon substrate having a specific resistance ranging from, e.g., 0.001 Ω·cm to 10 Ω·cm is used The monocrystalline silicon substrate and the silicon layer, each mentioned above, may also have a P-type conductivity. As the crystalline orientation, not only the (100) type, but also another typically used orientation may be used. It will be easily understood that the SOI substrate may also be formed by depositing, as silicon, not only monocrystalline silicon, but also polycrystalline silicon containing an impurity at a high concentration by a CVD method or the like. Besides a silicon substrate, there can be used a glass substrate, metal, ceramics, another semiconductor material, or the like. The thickness of each of the first and second silicon layers 11 and 12 can be set arbitrarily to a value in the range of 1 μm to 500 μm.

In the step shown in FIG. 4B, an Al layer with a thickness ranging from 0.1 μm to 2 μm is formed as the wiring layer 14 on the first silicon layer 11 of the SOI substrate by, e.g., a CVD method. In this case, the wiring layer 14 is formed on the entire surface of the first silicon layer 11.

Subsequently, in the step shown in FIG. 4C, trenches are formed in each of the wiring layer 14 and the first silicon layer 11 by a photolithographic/etching step to form the fixed electrode portions 17, the movable electrode fixing portions 15, the peripheral portion 19, and the connection portion 18. In this case, the movable electrode portion 16 is formed by removing the insulating layer 13 between the portion of the first silicon layer 11 serving as the movable electrode portion 16 and the second silicon layer 12 with a vapor-phase or liquid-phase HF (hydrogen fluoride) etchant. By the foregoing steps, the sensor portion 10 of the semiconductor dynamic quantity sensor is completed.

Next, a description will be given of a method for manufacturing the cap portion 20. It is assumed hereinbelow that a plurality of the cap portions 20 are formed on a single silicon wafer. FIGS. 5A to 5D are cross-sectional views illustrating the steps of manufacturing the cap portions 20 of the semiconductor dynamic quantity sensor according to the present embodiment.

Figure 5A:
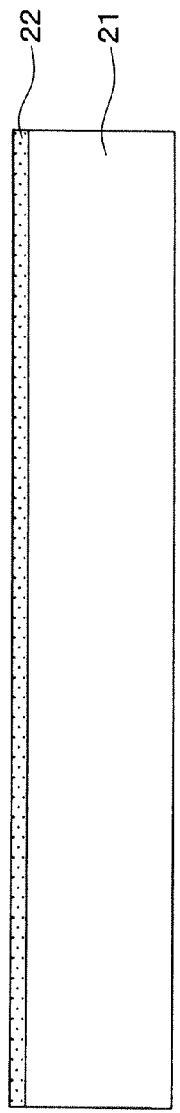
FIGS. 5A to 5D are cross-sectional views illustrating the steps of manufacturing the cap portion of the semiconductor dynamic quantity sensor according to the first embodiment.

First, in the step shown in FIG. 5A, the monocrystalline silicon substrate 21 having a specific resistance of, e.g., 0.01 Ω·cm oriented in the (100) plane is prepared, which is a so-called silicon wafer. On the silicon substrate 21, a $Si_3N_4$ film with a thickness ranging from 1 μm to 2 μm is formed as the first insulating film 22. The $Si_3N_4$ film can be formed by an LPCVD method or a plasma CVD method.

Figure 5B:
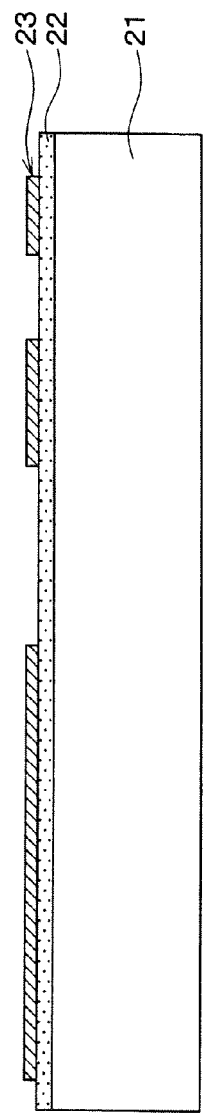

In the step shown in FIG. 5B, an Al layer with a thickness ranging from 0.1 μm to 2 μm is formed on the first insulating film 22, and patterned by a photolithographic/etching step to form the first wiring layer 23. It is also possible to use a so-called mask vapor deposition method using a porous mask made of a metal such as stainless steel.

Figure 5C:
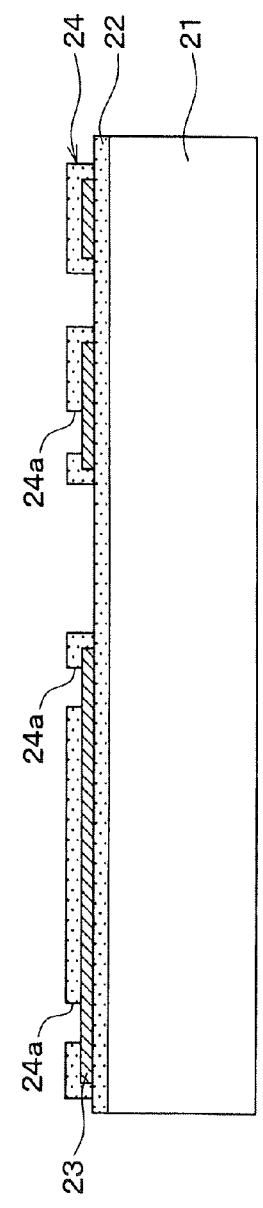

In the step shown in FIG. 5C, a $SiO_2$ film with a thickness ranging from 0.5 μm to 4 μm is formed as the second insulating film 24 on the first wiring layer 23 and the first insulating film 22. The second insulating film 24 is formed to have a thickness sufficiently larger than that of the first wiring layer 23, and the surface of the second insulating film 24 is planarized by a CMP method across the entire wafer. Instead of planarizing the second insulating film 24, it is also possible to form the second wiring layer 25 sufficiently thick on the entire surface to be formed in the next step, planarize the entire surface of the second wiring layer 25 by a CMP method, and pattern the second wiring layer 25 by a photolithographic/etching step. By patterning the $SiO_2$ film, opening parts 24a exposing the first wiring layer 23 are formed in the respective portions of the $SiO_2$ film facing the fixed electrode portions 17, the movable electrode fixing portions 15, and the connection portion 18 of the sensor portion 10. The opening parts 24a need not necessarily be formed at positions exactly opposing the fixed electrode portions 17, the movable electrode fixing portions 15, and the connection portion 18 of the sensor portion 10, and may also be formed at positions displaced from the exactly opposing positions. The opening parts 24a provide contact between the first wiring layer 23 and the second wiring layer 25 to be formed in the next step. At this time, the portion of the second insulating film 24 corresponding to at least the electrode part 16c of the movable electrode portion 16 has been partially removed in the same manner. This is for making the electrode part 16c of the movable electrode portion 16 less likely to come in contact with the cap portion 20.

Figure 5D:
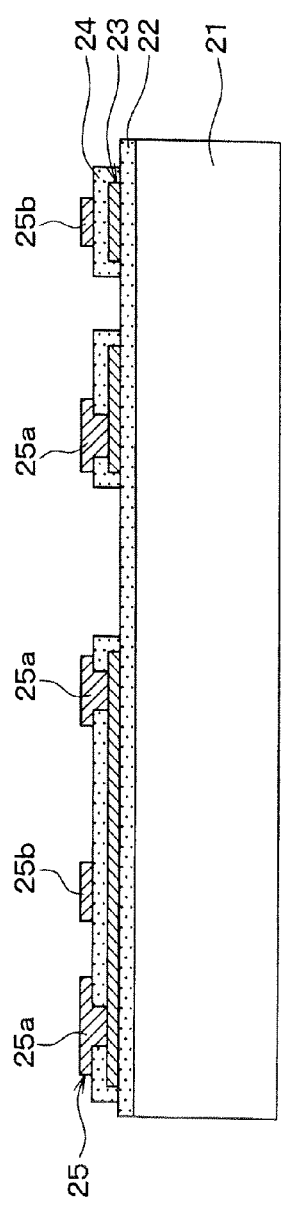

In the step shown in FIG. 5D, the wiring part 25a and the hermetically sealing part 25b, each as the second wiring layer 25, are formed by a method which forms and patterns an Al layer or a method using a mask. As a result, the wiring part 25a of the second wiring layer 25 and the first wiring layer 23 are connected to electrically conduct in the portions of the second insulating film 24 where the opening parts 24a are provided.

In this case, the wiring part 25a and the hermetically sealing part 25b are formed such that the wiring part 25a and the hermetically sealing part 25b have equal heights from the surface of the silicon substrate 21. The hermetically sealing part 25b may be either electrically floating, or at a predetermined potential such as, e.g., a ground potential as necessary. By the foregoing steps, the cap portion 20 of the semiconductor dynamic quantity sensor is completed. As the substrate of the cap portion 20, there can also be used a glass substrate, metal, ceramics, or another semiconductor material besides the silicon substrate 21.

Figure 6:
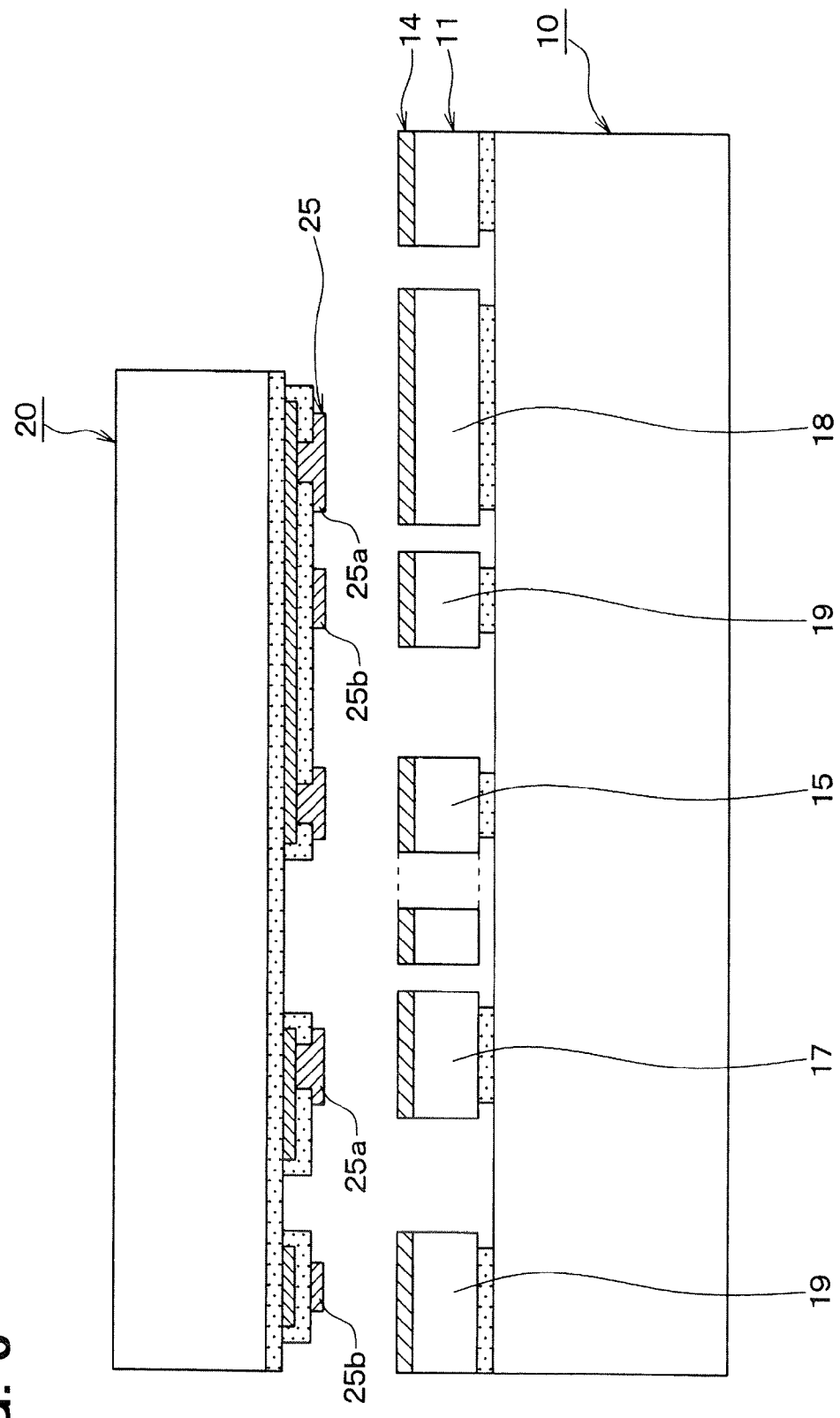
FIG. 6 is a view illustrating the manufacturing step of bonding the sensor portion and the cap portion of the semiconductor dynamic quantity sensor according to the first embodiment.

Next, as shown in FIG. 6, the sensor portion 10 and the cap portion 20 are bonded to each other. Specifically, the wiring layer 14 of the sensor portion 10 and the second wiring layer 25 of the cap portion 20 are brought into opposing relation, the respective surfaces thereof are activated by sputtering with argon ions or the like in high vacuum, and then the wiring layers 14 and 25 are solidly bonded at a temperature ranging from a room temperature to 500° C. by a so-called direct bonding method, as shown in JP-H10-92702 A. In this manner, the peripheral portion 19 of the sensor portion 10 and the hermetically sealing part 25b of the cap portion 10 are bonded to hermetically seal the sensor structures. On the other hand, by bonding the fixed electrode portions 17, the movable electrode fixing portions 15, and the connection portion 18 of the sensor portion 10 to the wiring part 25a of the cap portion 25, the sensor structures and the connection portion 18 of the sensor portion 10 are electrically connected.

In the present embodiment, the sensor portion 10 and the cap portion 20 are bonded by direct bonding as described above. However, it is also possible to perform solder connection or the like by, e.g., forming a metal layer of Ni, Cu, Au, or the like on the wiring layer 14 of the sensor portion 10 and on the second wiring layer 25 of the cap portion 20. Alternatively, it is also possible to provide connection using a conductive adhesive such as a silver paste, instead of performing solder connection. According to the method, in the case of the direct bonding described above, it is necessary for the wiring part 25a and the hermetically sealing part 25b to have equal heights from the surface of the silicon substrate 21 in the second wiring layer 25 of the cap portion 20. However, in the case of using the solder connection or the conductive adhesive, a solder or the adhesive functions to adjust the respective heights of the wiring part 25a and the hermetically sealing part 25b, so that the wiring part 25a and the hermetically sealing part 25b need not have equal heights from the surface of the silicon substrate 21. That is, in the case of using the solder connection and the conductive adhesive, the sensor structures can be hermetically sealed by pressing the cap portion 10 against the sensor portion 10.

Figure 7:
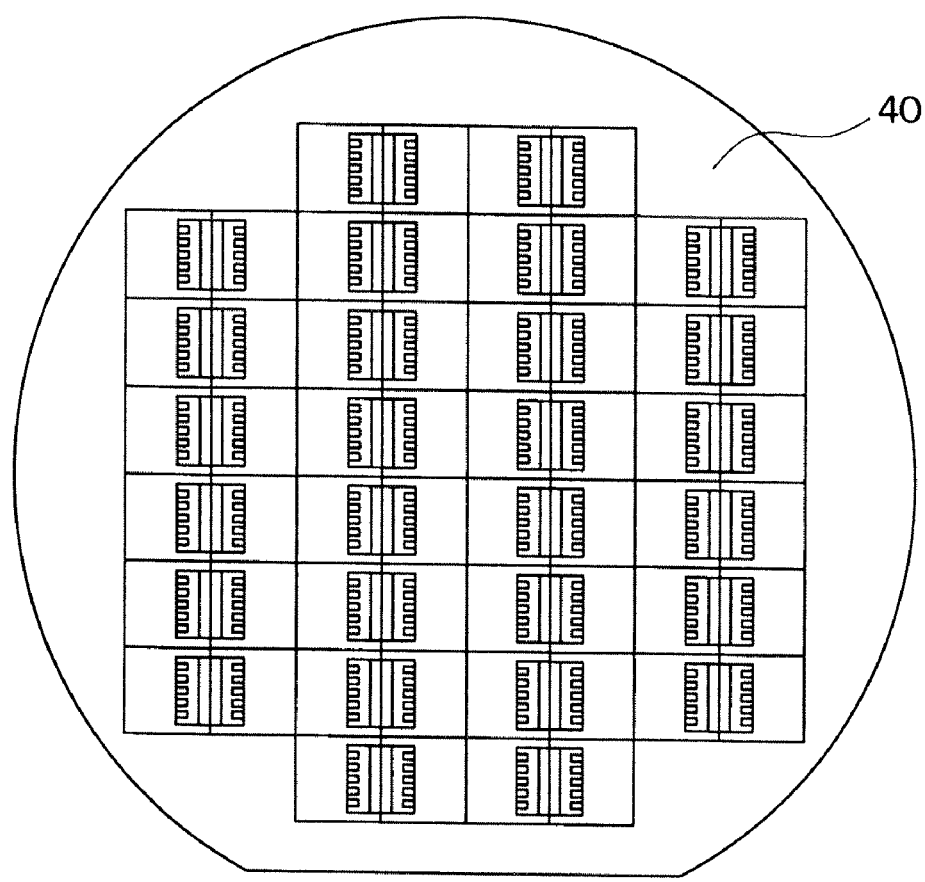
FIG. 7 is a view showing a plurality of semiconductor dynamic quantity sensors formed on a single silicon wafer.

As described above, the sensor portion 10 and the cap portion 20 are formed on the respective silicon wafers, which are then laminated on each other. As a result, as shown in FIG. 7, a plurality of the semiconductor dynamic quantity sensors are formed on a wafer 40. Therefore, by cutting the wafer 40 shown in FIG. 7 by dicing, the wafer 40 can be divided on a per chip basis to provide the individual semiconductor dynamic quantity sensors.

It is to be noted that, in an actual situation, the sensor portions 10 and the cap portions 20 are formed on the wafer 40 such that several hundreds of semiconductor dynamic quantity sensors are included therein, and the wafer 40 is eventually divided on a per chip basis. On the other hand, it is also possible to manufacture the semiconductor dynamic quantity sensors by discretely forming the sensor portions 10 and the cap portions 20, and bonding the individual sensor portions 10 and the individual cap portions 20, as shown in FIG. 6.

Thereafter, each of the semiconductor dynamic quantity sensors is mounted on a circuit board or the like not shown, and the connection portion 18 and an electric circuit, not shown, are wire bonded to allow an electric signal in accordance with a physical quantity produced in the sensor structures to be outputted to the outside of the semiconductor dynamic quantity sensor.

As described above, the present embodiment is characterized in that a multilayer structure comprising the first insulating film 22, the first wiring layer 23, the second insulating film 24, and the second wiring layer 25 is provided on the surface of the cap portion 20 of the semiconductor dynamic quantity sensor which opposes the sensor portion 10. This obviates the necessity to provide a complicated wiring layer in the sensor portion 10 provided with the sensor structures serving as the sensing portion, allows the simplification of the structure of the sensor portion 10, and thereby allows the simplification of the structure of the semiconductor dynamic quantity sensor.

By providing the cap portion 20 with the wiring layer and causing it to function as a hermetical seal, the step of providing the sensor portion 10 with the wiring layer becomes unnecessary, and it is no more necessary to provide the sensor portion 10 with a multilayer structure. As a result, it is possible to simplify the process of manufacturing the sensor portion 10, and also simplify the process of manufacturing the entire semiconductor dynamic quantity sensor. This allows an improvement in the yield of the semiconductor dynamic quantity sensor and a cost reduction.

Additionally, the wiring part 25a and the hermetically sealing part 25b, each composing the second wiring layer 25, have equal heights from the surface of the silicon substrate 21. This allows the connection portion 18 and the sensor structures to be electrically connected by the wiring part 25a by merely bonding the sensor portion 10 and the cap portion 20, and also allows the sensor structures to be hermetically sealed by the hermetically sealing part 25b.

Moreover, the recessed part 21a is provided in the cap portion 20 to expose the connection portion 18 of the sensor portion 10 therefrom. The arrangement can keep a tool for performing wire bonding from contact with the cap portion 20, and also allows easy wire bonding to the connection portion 18. As a result, it is also unnecessary to provide the cap portion 20 with through holes for wire bonding. This can prevent an increase in the size of the cap portion 20, and therefore allows a reduction in chip size.

Second Embodiment

In the present embodiment, a description will be given only of a portion different from the semiconductor device according to the first embodiment. In the first embodiment described above, the sensor portion 10 of the semiconductor dynamic quantity sensor is provided with the connection portion 18 for allowing electrical connection to the outside. The present embodiment has a characteristic structure which allows electrical connection from the cap portion 20 to the outside.

Figure 8:
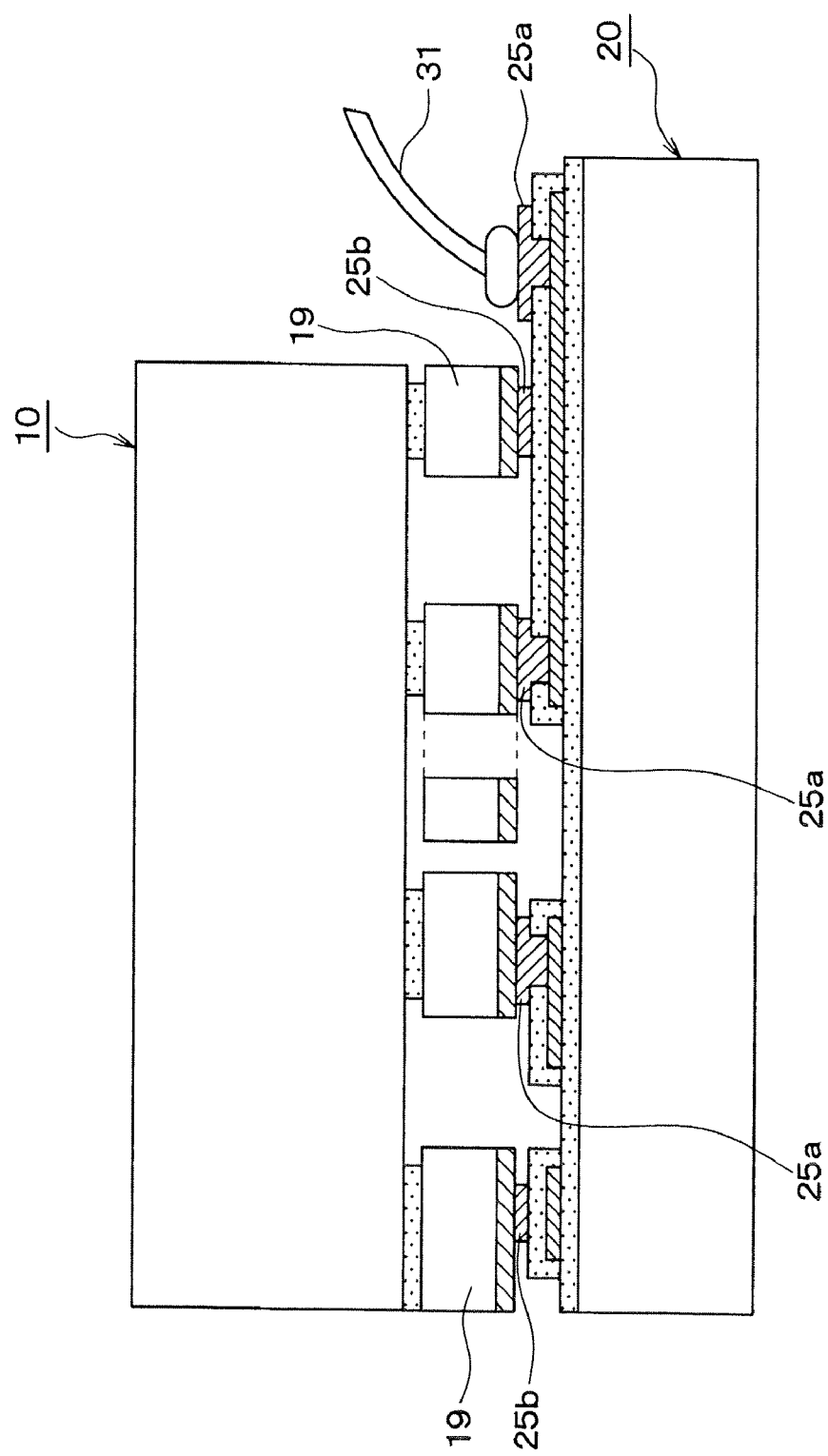
FIG. 8 is a schematic cross-sectional view of a semiconductor dynamic quantity sensor according to a second embodiment of the present invention.

FIG. 8 is a schematic cross-sectional view of a semiconductor dynamic quantity sensor according to the present embodiment. As shown in the drawing, a structure is provided in which the connection portion 18 of the sensor portion 10 shown in FIG. 2 is not provided, and the sensor portion 10 has only the portion surrounded by the peripheral portion 19. On the other hand, the cap portion 20 has the same structure as in the first embodiment.

Therefore, as shown in FIG. 8, the size of the sensor portion 10 which is not provided with the connection portion 18 is accordingly smaller than the size of the sensor portion 10 shown in FIG. 2. When the sensor structures of the sensor portion 10 are sealed by the hermetically sealing part 25b of the cap portion 20, the wiring part 25a of the cap portion 20, which are bonded to the connection portion 18 of the sensor portion 10 shown in FIG. 2, are exposed.

In the present embodiment, the exposed, i.e., unsealed wiring part 25a is used as a pad in the sensor portion 10. As shown in FIG. 8, the bonding wires 31 are connected to the exposed wiring part 25a to electrically connect the semiconductor dynamic quantity sensor and the outside.

In this manner, the wiring part 25a of the cap portion 20 can be connected to the outside. In this case, the size of the sensor portion 10 is smaller than in the first embodiment, while the size of the cap portion 20 remains unchanged. This allows the semiconductor dynamic quantity sensor shown in FIG. 2 to be reduced in size. Additionally, in the present embodiment, the recessed part 21a, which is provided in the silicon substrate 21 of the cap portion 20 in the first embodiment, is provided in the sensor portion 10. In the case of individual assembly, not wafer-to-wafer assembly, the recessed part 21a may also be eliminated.

Third Embodiment

Figure 9:
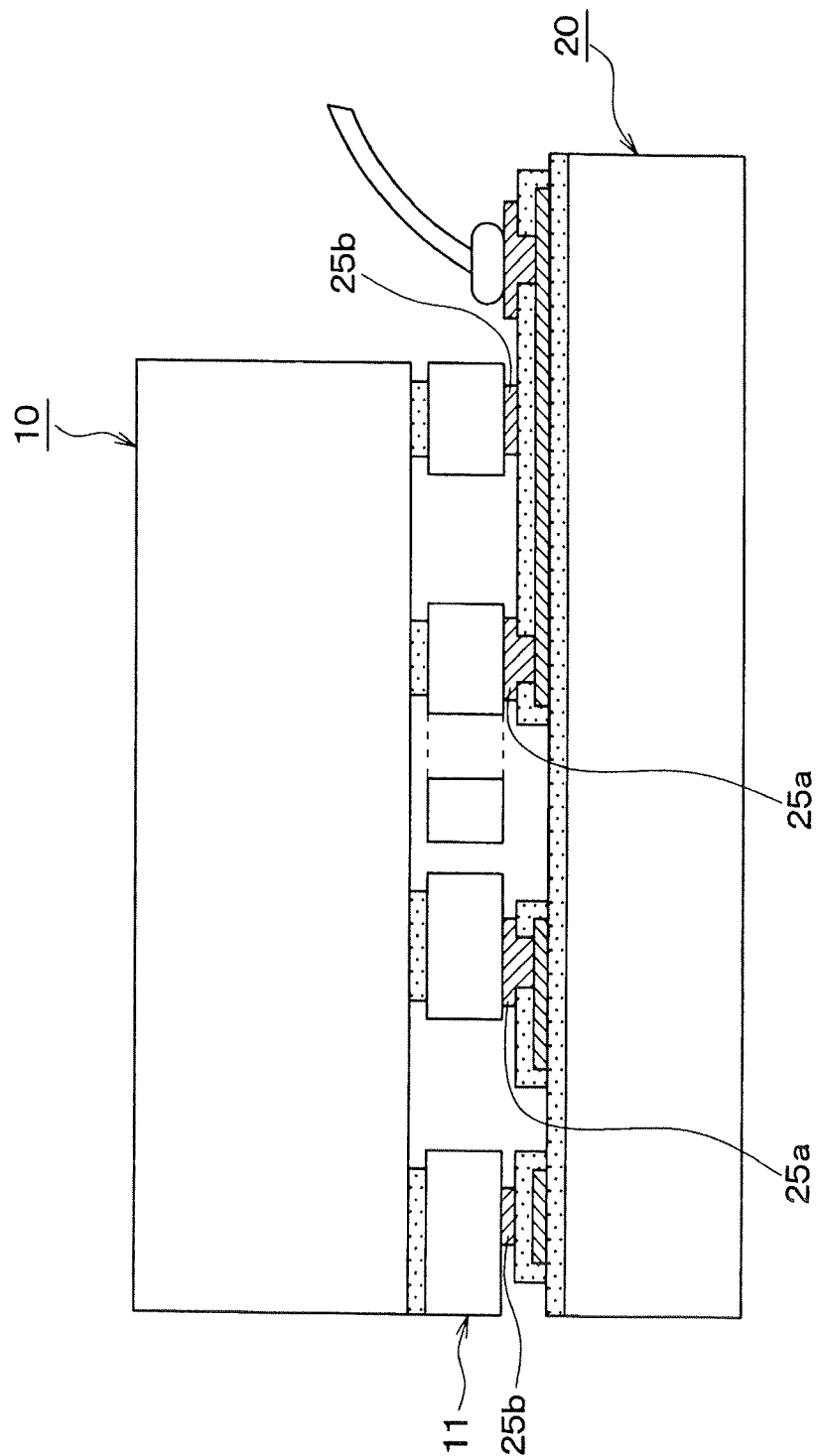
FIG. 9 is a schematic cross-sectional view of a semiconductor dynamic quantity sensor according to a third embodiment of the present invention.

In the present embodiment, a description will be given only of a portion different from the semiconductor device according to the second embodiment. FIG. 9 is a schematic cross-sectional view of the semiconductor dynamic quantity sensor according to the present embodiment. The present embodiment has a configuration in which the wiring layer 14 is not provided on the first silicon layer 11 in the sensor portion 10 shown in FIG. 8, and the wiring part 25a and the hermetically sealing part 25b of the second wiring layer 25 of the cap portion 20 are connected directly to the first silicon layer 11 of the sensor portion 10. Particularly in the case where P-type silicon is used in the first silicon layer 11 and an Al layer is used as the second wiring layer 25, the specific resistance of silicon is in the range of 0.01 to 1 $\Omega\cdot cm$ so that an ohmic contact is more easily made than with N-type silicon. Accordingly, P-type silicon at a relatively low concentration can be used.

When the cap portion 20 is bonded to the sensor portion 10 with such a structure, the Al layer can be bonded directly to the silicon layer at a room temperature. In this case, it is possible to obviate the necessity for the step of a thermal treatment or the like, and simplify the manufacturing process.

In addition, since the sensor portion 10 need not be provided with the wiring layer 14, it is possible to omit the step of manufacturing the wiring layer 14, and also simplify the structure of the sensor portion 10.

Fourth Embodiment

In the present embodiment, a description will be given only of a portion different from the semiconductor device according to the first embodiment. The present embodiment is characterized in that an IC circuit portion is provided in the semiconductor dynamic quantity sensor, especially in the cap portion 20.

Figure 10:
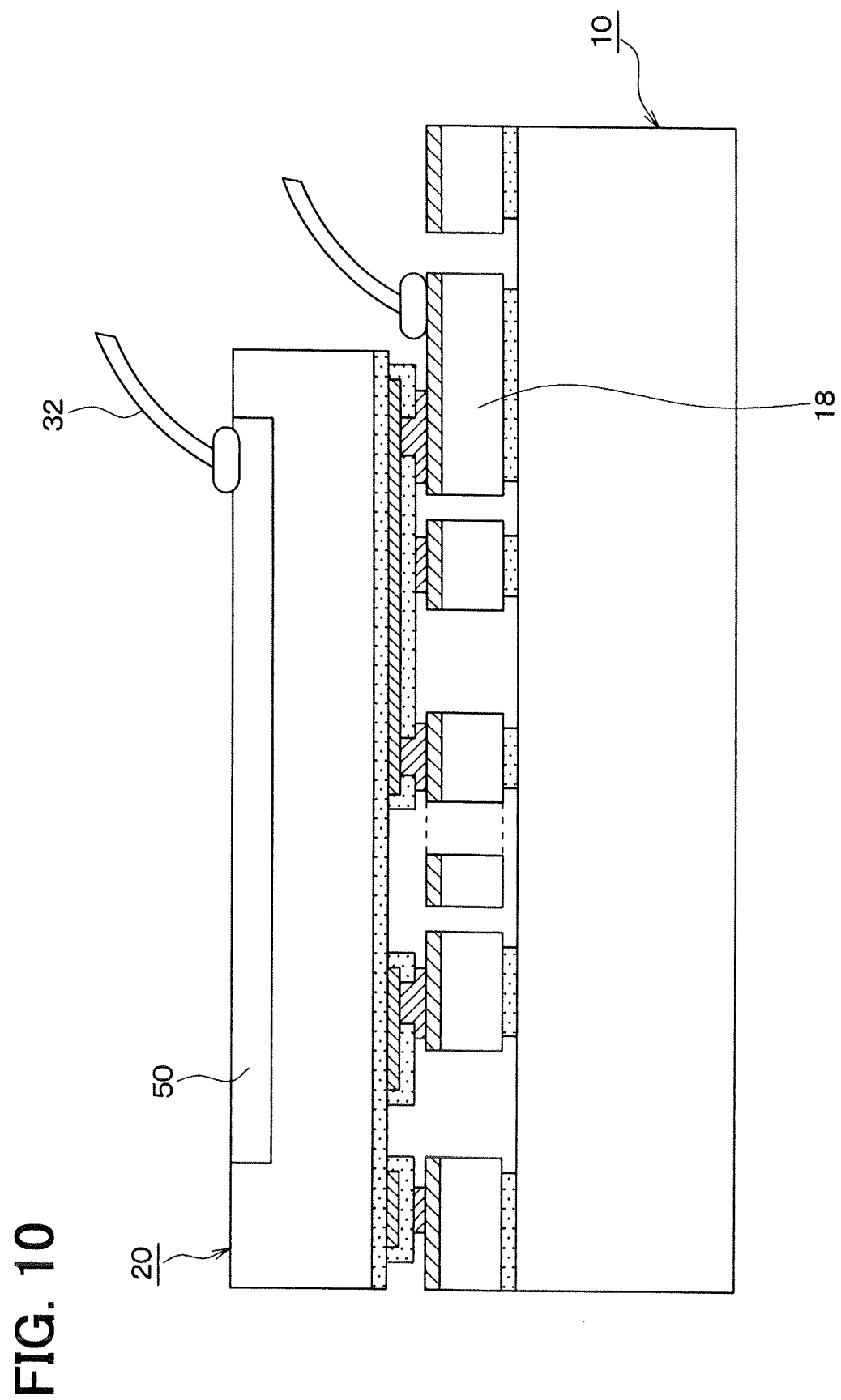
FIG. 10 is a schematic cross-sectional view of a semiconductor dynamic quantity sensor according to a fourth embodiment of the present invention.

FIG. 10 is a schematic cross-sectional view of the semiconductor dynamic quantity sensor according to the present embodiment. As shown in the drawing, an IC circuit portion 50 is provided on the surface of the silicon substrate 21 composing the cap portion 20 which is opposite to the surface provided with the first insulating film 22.

The IC circuit portion 50 is provided with circuits such as, e.g., an amplification circuit for amplifying a signal equivalent to a physical quantity detected by the sensor portion 10 and an arithmetic operation circuit for performing an arithmetic operation based on the signal. The IC circuit portion 50 is formed during the manufacturing of the cap portion 20, especially before multilayer wiring including the first wiring layer 23 is formed.

To the IC circuit portion 50, a wire 32 is connected. The wire 32 is connected to, e.g., the connection portion 18 of the sensor portion 10, to a circuit provided outside the semiconductor dynamic quantity sensor, or the like. Thus, the structure can be implemented in which the IC circuit portion 50 is provided in the cap portion 20.

Fifth Embodiment

Figure 11:
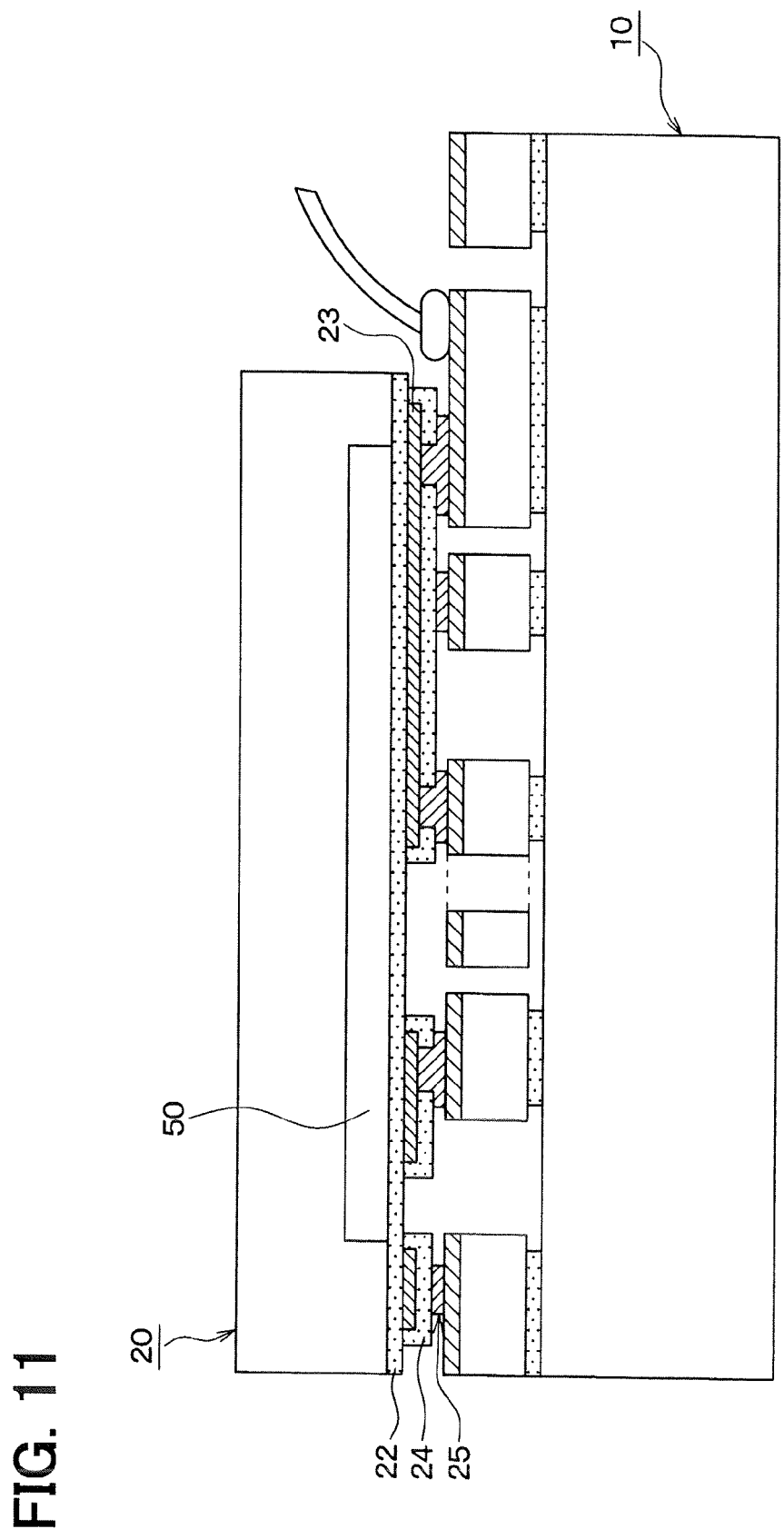
FIG. 11 is a schematic cross-sectional view of a semiconductor dynamic quantity sensor according to a fifth embodiment of the present invention.

In the present embodiment, a description will be given only of a portion different from the semiconductor device according to the fourth embodiment. FIG. 11 is a schematic cross-sectional view of the semiconductor dynamic quantity sensor according to the present embodiment. As shown in the drawing, the IC circuit portion 50 is provided on the surface of the silicon substrate 21 of the cap portion 20 opposing the sensor portion 10.

Then, the first insulating film 22 is formed to cover the surface of the silicon substrate 21 including the IC circuit portion 50, and the first wiring layer 23, the second insulating film 24, and the second wiring layer 25 are formed thereon in this order. In this case, an opening not shown is provided in the first insulating film 22, and a so-called IC chip manufacturing method can be used. Further, the wiring layer of the IC chip is made of Al or Cu so that a multilayer wiring layer can also be used. Electrical connection is provided between the IC circuit portion 50 and the first wiring layer 23 via the opening.

Such a structure of the cap portion 20 allows the step of providing the first insulating film 22 to be performed immediately after the IC circuit portion 50 is provided on the surface of the silicon substrate 21. Moreover, the wire 32 need not be connected to the IC circuit portion 50. In this manner, the step of manufacturing the cap portion 20 according to the fourth embodiment can be simplified.

Sixth Embodiment

Figure 12:
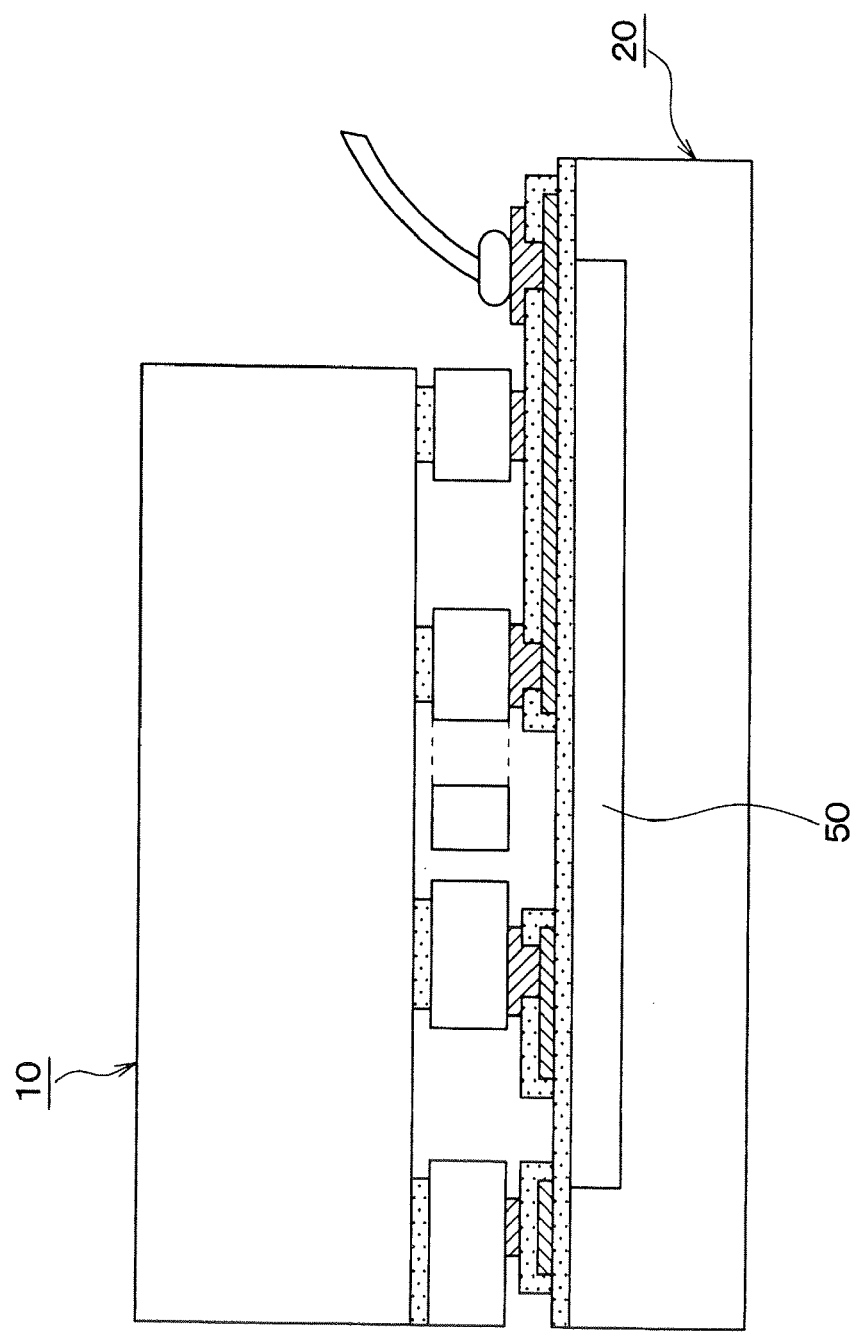
FIG. 12 is a schematic cross-sectional view of a semiconductor dynamic quantity sensor according to a sixth embodiment of the present invention.

In the present embodiment, a description will be given only of a portion different from the semiconductor device according to the third embodiment. FIG. 12 is a schematic cross-sectional view of the semiconductor dynamic quantity sensor according to the present embodiment. As shown in the drawing, the cap portion 20 is bonded to the sensor portion 10 which is not provided with the connection portion 18. The IC circuit portion 50 is provided on the surface of the silicon substrate 21 of the cap portion 20 opposing the sensor potion 10.

In this manner, the structure can be implemented in which the IC circuit portion 50 is provided in the structure of FIG. 9.

The same shall apply to the structure shown in FIG. 8. In this case, as shown in FIG. 10, the IC circuit portion 50 is provided in the structure shown in FIG. 8.

Seventh Embodiment

Figure 13:
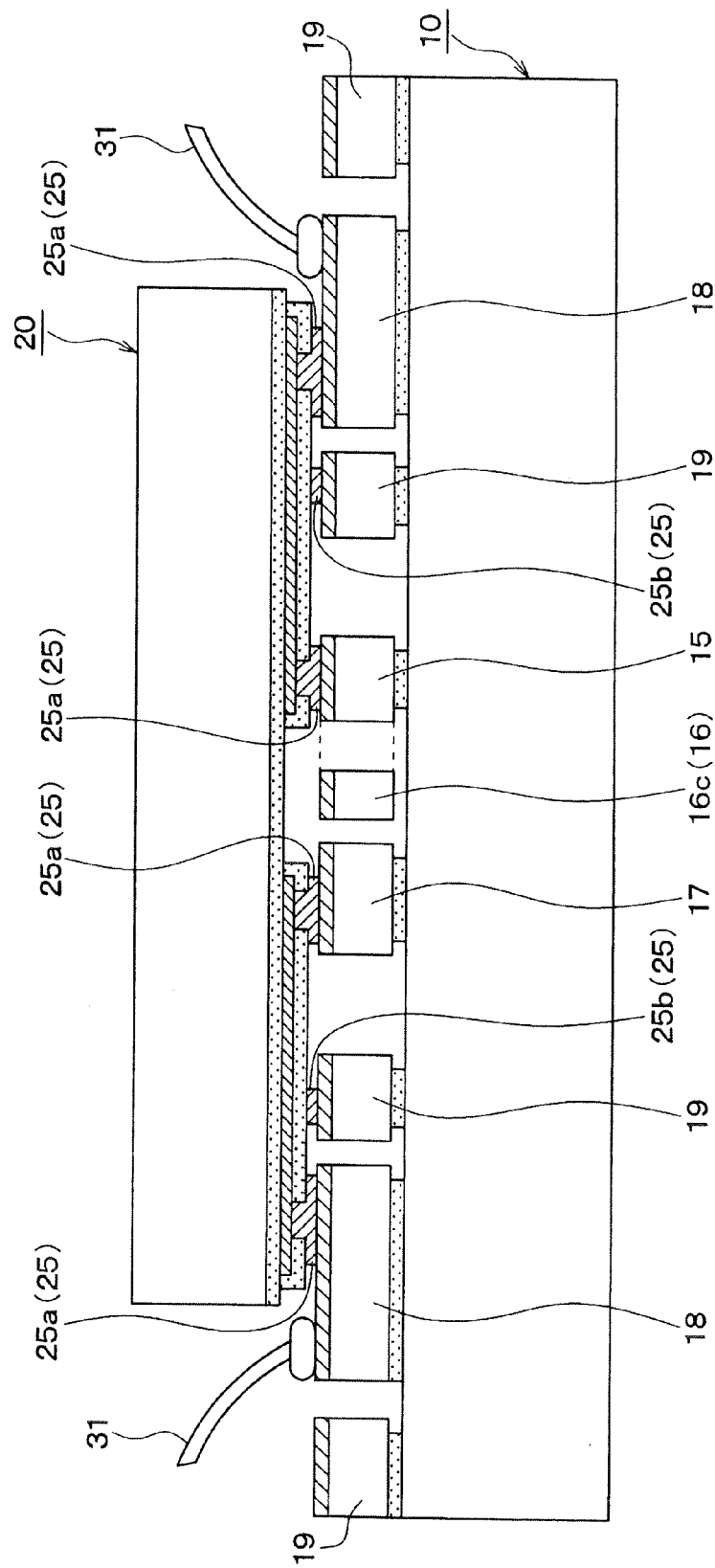
FIG. 13 is a schematic cross-sectional view of a semiconductor dynamic quantity sensor according to a seventh embodiment of the present invention.

In the present embodiment, a description will be given only of a portion different from the semiconductor device according to the first embodiment. FIG. 13 is a schematic cross-sectional view of the semiconductor dynamic quantity sensor according to the present embodiment. As shown in the drawing, a plurality of the connection portions 18 are provided in the sensor portion 10.

In the present embodiment, the bidirectional connection portion 18 is provided in addition to the unidirectional connection portion 18 shown in FIG. 2. This allows the wires 31 to be connected in multiple directions from the sensor portion 10. In this case, in the cap portion 20, the first wiring layer 23 is formed in the direction in which the connection portions 18 are provided in the sensor portion 10 so as to span over the peripheral portion 19 of the sensor portion 10. In the present embodiment also, the wiring part 25a and the hermetically sealing part 25b of the second wiring layer 25 have equal heights from the surface of the silicon substrate 21.

Thus, the connection portions 18 can be provided in multiple directions in the sensor portion 10. It is further possible to apply the present embodiment to the second embodiment shown in FIG. 8, and provide the connection portions 18 in multiple directions. It is also possible to form the peripheral portion 19 encircling the entire sensor portion 10 once, and shield the inside of the peripheral portion 19 by connecting a wire, not shown, to the peripheral portion 19.

In the present embodiment also, the structure can be implemented in which the IC circuit portion 50 is provided in the cap portion 20, in the same manner as in, e.g., the fourth and fifth embodiments.

Eighth Embodiment

Figure 14:
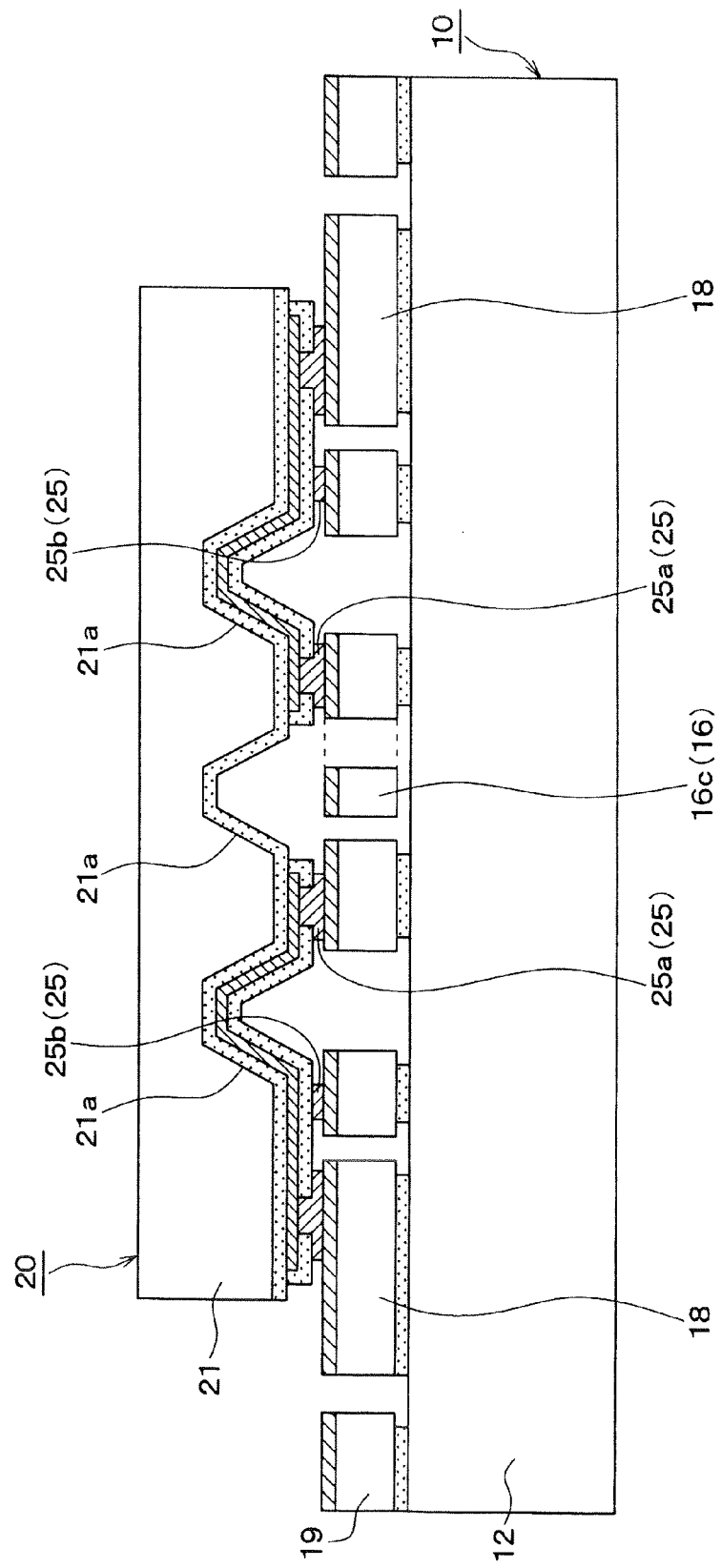
FIG. 14 is a schematic cross-sectional view of a semiconductor dynamic quantity sensor according to an eighth embodiment of the present invention.

In the present embodiment, a description will be given only of a portion different from the semiconductor device according to the seventh embodiment. FIG. 14 is a schematic cross-sectional view of the semiconductor dynamic quantity sensor according to the present embodiment. As shown in the drawing, the recessed parts 21a are provided in the surface of the silicon substrate 21 of the cap portion 20 opposing the sensor portion 10.

The recessed parts 21a are provided in the region surrounded by the hermetically sealing part 25b. Specifically, in the surrounded region, the recessed parts 21a are formed in the area of the silicon substrate 21 other than the portion where the wiring part 25a and the sensor portion 10 are bonded, i.e., in the silicon substrate 21 opposing the second silicon layer 12 of the sensor portion 10. The recessed part 21a is also provided in the area of the silicon substrate 21 opposing the movable electrode portion 16.

The recessed parts 21a reduce the influence of electrical or mechanical contact or the like received by the sensor structures provided in the sensor portion 10 from the cap portion 20. Therefore, in the structure shown in FIG. 14, the three recessed parts 21a are provided in the silicon substrate 21. However, it is sufficient for the recessed part 21a to be provided at least in the area opposing the movable electrode portion 16 which detects a physical quantity. Thus, it is possible to provide the recessed parts 21a in the silicon substrate 21 of the cap portion 20, and reduce influence from the silicon substrate 21 to the sensor structures.

It is also possible to, e.g., provide the foregoing structure shown in FIG. 14 with the IC circuit portion 50 shown in FIG. 10. Alternatively, it is also possible to implement a structure as shown in FIGS. 8 and 9 by eliminating the connection portion 18 of the sensor portion 10.

Ninth Embodiment

In the present embodiment, a description will be given only of a portion different from the semiconductor device according to the first embodiment. The present embodiment is characterized in that the silicon substrate 21 of the cap portion 20 and the peripheral portion 19 of the sensor portion 10 are set at the same electric potential.

Figure 15:
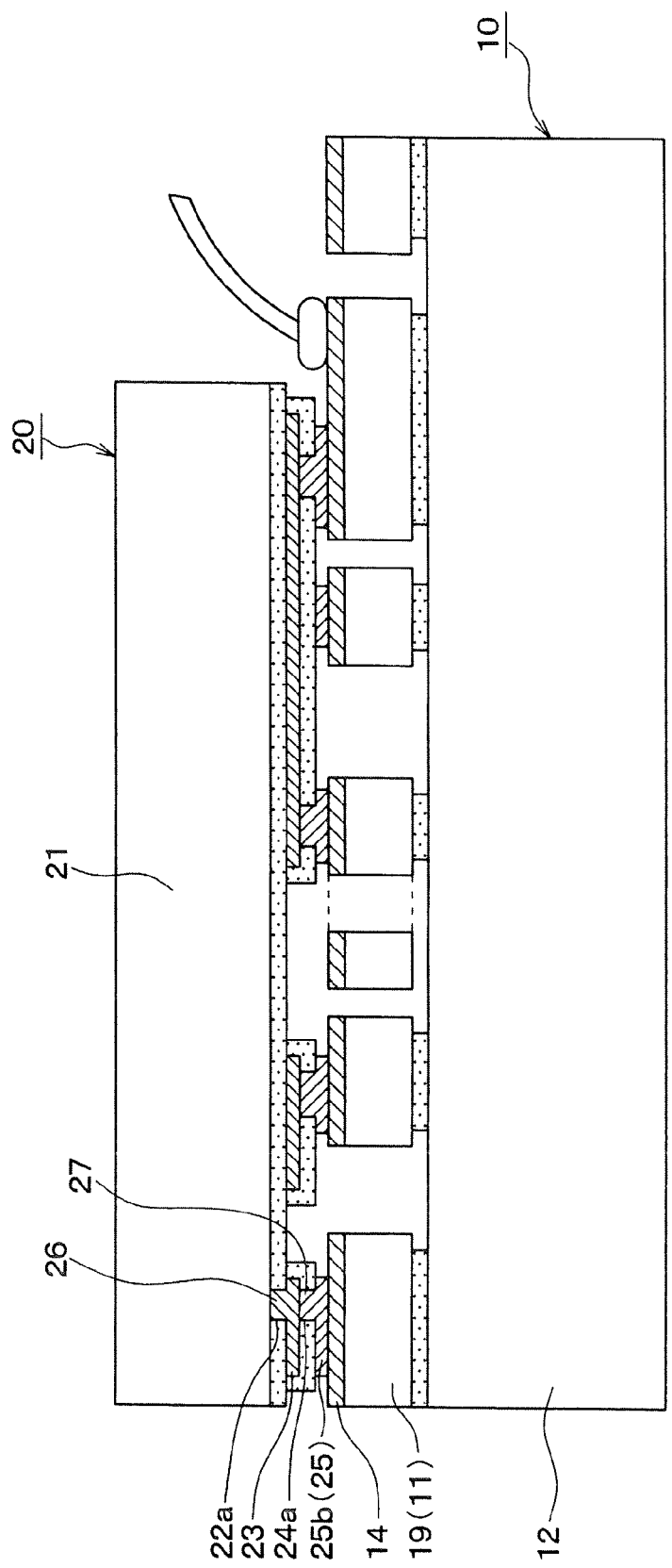
FIG. 15 is a schematic cross-sectional view of a semiconductor dynamic quantity sensor according to a ninth embodiment of the present invention.

FIG. 15 is a schematic cross-sectional view of the semiconductor dynamic quantity sensor according to the present embodiment. As shown in the drawing, an opening part 22a and the opening part 24a are provided in the respective portions of the first insulating film 22 and the second insulating film 24, each composing the cap portion 20, which oppose the peripheral portion 19 provided at the outer edge portion of the first silicon layer 11. In the opening parts 22a and 24a, conduction contact portions 26 and 27 are formed, respectively.

The conduction contact portion 26 formed in the opening part 22a of the first insulating film 22 corresponds to a first conduction contact portion. The conduction contact portion 27 formed in the opening part 24a of the second insulating film 24 corresponds to a second conduction contact portion.

The conduction contact portion 26 functions to electrically connect the silicon substrate 21 and the first wiring layer 23. The conduction contact portion 27 functions to electrically connect the first wiring layer 23 and the wiring part 25a of the second wiring layer 25. By such a structure, the silicon substrate 21, the conduction contact portion 26, the first wiring layer 23, the conduction contact portion 27, the wiring part 25a, the wiring layer 14, and the peripheral portion 19 of the first silicon layer 11 are brought into an electrically conducting state, and set at the same potential.

In the structure, these conduction contact portions 26 and 27 are provided along the entire peripheral portion 19 positioned at the outer edge portion of the first silicon layer 11. However, the conduction contact portions 26 and 27 may also be provided along a part of the peripheral portion 19.

On the other hand, the potential of the second silicon layer 12 of the sensor portion 10 can be set by, e.g., connecting the second silicon layer 12 onto a lead frame with silver paste or the like.

By thus providing the wiring layer of the cap portion 20 with the conduction contact portions 26 and 27 electrically connecting the peripheral portion 19 and the silicon substrate 21, the structure can be implemented in which the semiconductor physical quantity sensor is provided with a shield structure.

It is to be noted that what has been achieved in the second to eighth embodiments can also be achieved in the semiconductor dynamic quantity sensor shown in FIG. 15.

Tenth Embodiment

In the present embodiment, a description will be given only of a portion different from the semiconductor device according to the ninth embodiment. The present embodiment is characterized in that the peripheral portion 19 of the first silicon layer 11 and the second silicon layer 12 are electrically connected in the sensor portion 10.

FIG. 16 is a schematic cross-sectional view of the semiconductor dynamic quantity sensor according to the present embodiment. The semiconductor physical quantity sensor shown in FIG. 16 has a structure implemented by providing the insulating layer 13 between the peripheral portion 19 and the second silicon layer 12 of the structure shown in FIG. 15 with substrate contact parts 11a for electrically connecting the peripheral portion 19 and the second silicon layer 12. The substrate contact parts 11a are formed of, e.g., polycrystalline (poly-)silicon.

The substrate contact parts 11a may be formed either along the entire peripheral portion 19 provided in the first silicon layer 11, or along a part of the peripheral portion 19.

Figure 17A:
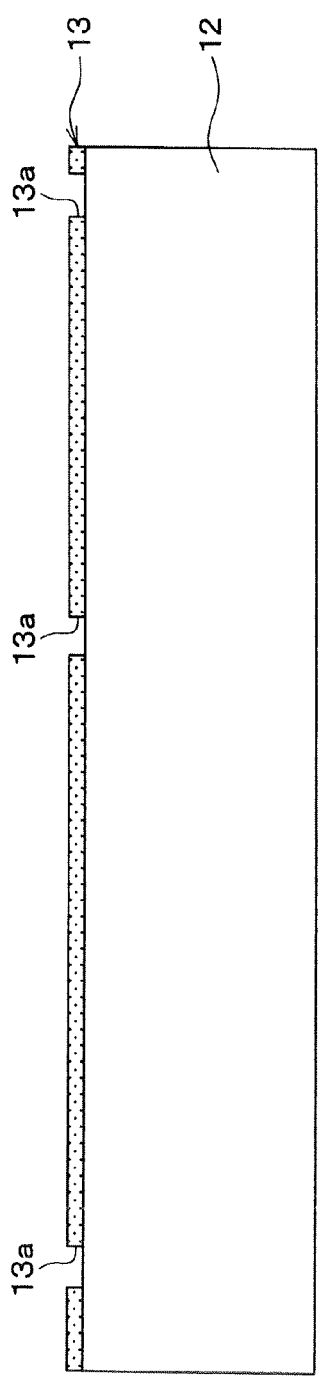
FIGS. 17A to 17C are cross-sectional views illustrating the steps of manufacturing the sensor portion according to the tenth embodiment.
Figure 17B:
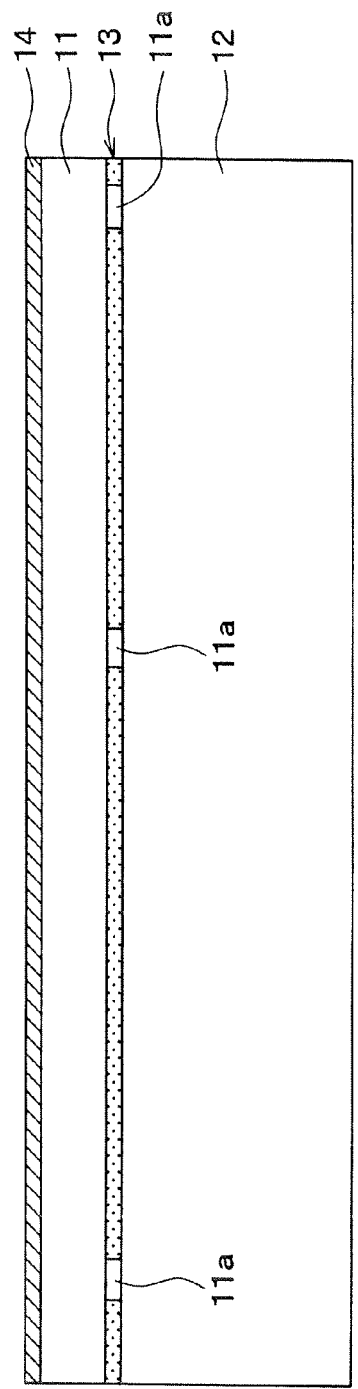
Figure 17C:
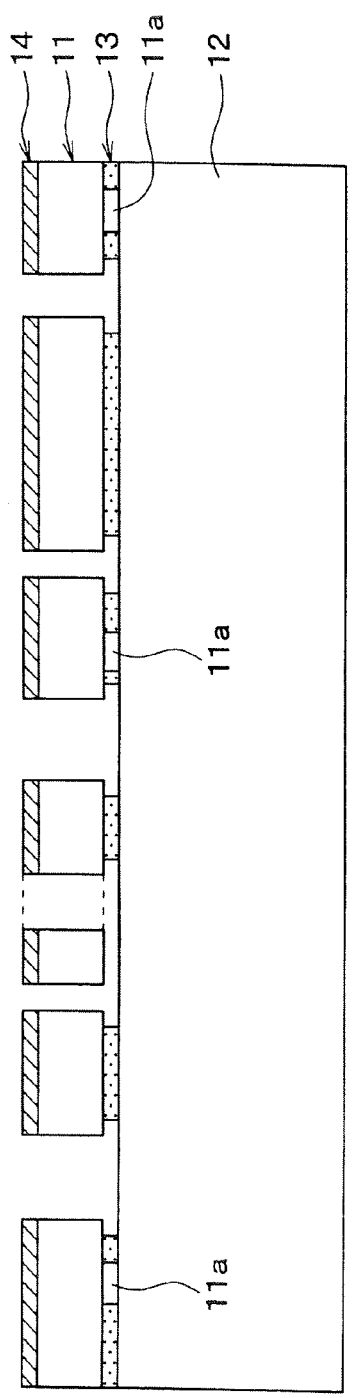

Next, a description will be given of a method for manufacturing the sensor portion 10 according to the present embodiment. FIGS. 17A to 17C are cross-sectional views illustrating the steps of manufacturing the sensor portion 10 according to the present embodiment.

First, in the step shown in FIG. 17A, a supporting base as the second silicon layer 12 is prepared, and a $SiO_2$ film with a thickness of 0.1 µm to 2 µm is formed as the insulating layer 13 on the supporting base. Then, by a photolithographic/etching step, opening parts 13a exposing the second silicon layer 12 are provided in the area of the insulating layer 13 where the peripheral portion 19 is provided.

Subsequently, in the step shown in FIG. 17B, a polysilicon layer as the first silicon layer 11 with a thickness of 3 µm to 100 µm is deposited on the insulating layer 13 by, e.g., a CVD method. In forming the polysilicon layer by the CVD method, doped polysilicon at a high concentration and with a low resistance can be obtained by simultaneously supplying P, As, B, and the like as impurities. In this manner, the substrate contact parts 11a are formed in the opening parts 13a provided in the insulating layer 13, and the first silicon layer 11 is formed. Then, the wiring layer 14 is formed on the first silicon layer 11 in the same manner as in the step shown in FIG. 4B.

Thereafter, in the step shown in FIG. 17C, the peripheral portion 19 and the sensor structures are formed in the first silicon layer 11 by performing the same step as the step shown in FIG. 4C. In this manner, the structure can be obtained which has the substrate contact parts 11a provided between the peripheral portion 19 and the second silicon layer 12, and electrically connects the peripheral portion 19 and the second silicon layer 12, whereby the sensor portion 10 according to the present embodiment is completed.

By thus providing the substrate contact parts 11a electrically connecting the peripheral portion 19 and the second silicon layer 12 to be located therebetween, the second silicon layer 12 can be set at the same potential as that of the silicon substrate 21 of the cap portion 20, and a shield structure can be formed. Since this allows the second silicon layer 12 to reduce influence from the outside, a shield effect higher than that of the structure shown in FIG. 15 can be obtained. In the case of forming the polysilicon layer by a CVD method in the manufacturing method, when the polysilicon layer is formed at a higher temperature ranging from, e.g., 900° C. to 1200° C., the portions of the substrate contact parts 11a can be formed of monocrystalline silicon by epitaxial growth.

Eleventh Embodiment

In the present embodiment, a description will be given only of a portion different from the semiconductor devices according to the ninth and tenth embodiments. In the structures according to the ninth and tenth embodiments described above, the conduction contact portions 26 and 27 are provided along the entire peripheral portion 19 located at the outer edge portion of the first silicon layer 11, or along a part of the peripheral portion 19. However, it is also possible to adopt a structure in which a conduction contact portion is provided at one place.

Figure 18:
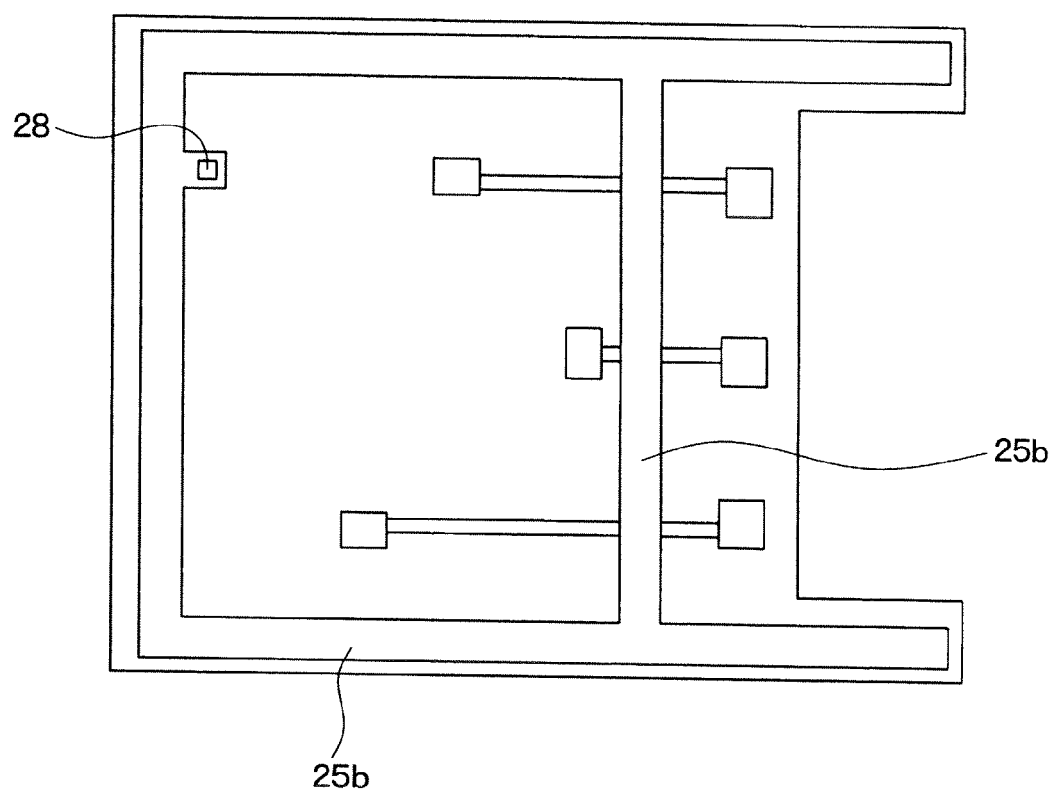
FIG. 18 is a plan view of the cap portion according to an eleventh embodiment of the present invention.

FIG. 18 is a plan view of the cap portion 20 according to the present embodiment. As shown in the drawing, a conduction contact portion 28 is provided only at one place in the hermetically sealing part 25b. Such conduction contact portions 28 may also be provided at a plurality of positions. Thus, the conduction contact portion 28 can be provided singly at one position.

Twelfth Embodiment

In the present embodiment, a description will be given only of a portion different from the semiconductor device according to the sixth embodiment. The present embodiment is characterized in that the sensor portion 10 bonded to the cap portion 20 is provided with bumps.

Figure 19:
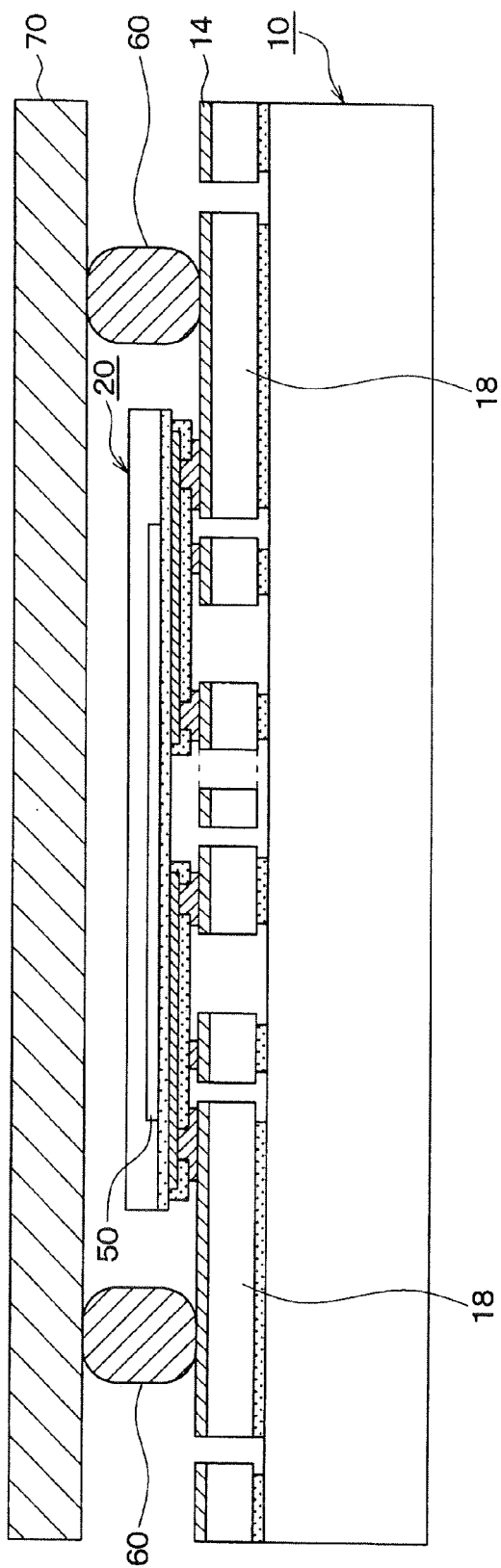
FIG. 19 is a schematic cross-sectional view of a semiconductor dynamic quantity sensor according to a twelfth embodiment of the present invention.

FIG. 19 is a schematic cross-sectional view of the semiconductor dynamic quantity sensor according to the present embodiment. As shown in the drawing, bumps 60 for flip-chip mounting (ball bonding) are provided on the connection portion 18 in the sensor portion 10. More specifically, the bumps 60 are provided on the wiring layer 14 of Al of the connection portion 18. The plurality of bumps 60 are formed in the sensor portion 10.

The cap portion 20 is formed to have a thickness ranging from, e.g., 10 μm to 100 μm. On the other hand, the bumps 60 are formed to be higher than the cap portion 20 relative to the sensor portion 10. As the bumps 60, Au balls are formed by way of example. The bumps 60 may also be formed of Cu.

On the bumps 60, a circuit board 70 is flip-chip mounted. Since the bumps 60 are higher than the cap portion 20 relative to the sensor portion 10, the flat circuit board 70 can be bonded. When the heights of the bumps 60 are set to, e.g., about 30 μm, small-scale flip chip mounting (ball bonding) can be implemented.

Although the IC circuit portion 50 is formed in the cap portion 20, the cap portion 20 need not be provided with the IC circuit portion 50.

The bumps 60 are formed as follows. The SOI substrate is prepared, and the wiring layer 14 is formed on the first silicon layer 11. Then, a resist is formed on the wiring layer 14, and patterned to expose the areas of the wiring layer 14 where the bumps 60 are to be formed. Thereafter, Cu plating, e.g., is performed with respect to the upper surface of the resist, and then the resist is removed. As a result, the bumps 60 are left on the areas of the wiring layer 14 where the resist is opened. In this manner, the bumps 60 can be formed.

Then, after the bumps 60 are formed, the cap portion 20 is bonded to the sensor portion 10, as described above. Thereafter, the circuit board 70 is prepared, and flip-chip mounted on the sensor portion 10 via the bumps 60, whereby the sensor shown in FIG. 19 is completed.

By thus providing the sensor portion 10 with the bumps, the circuit board 70 can be flip-chip mounted on the sensor portion 10, and a multilayer structure can further be realized.

Thirteenth Embodiment

In the present embodiment, a description will be given only of a portion different from the semiconductor device according to the twelfth embodiment. In the twelfth embodiment described above, the bumps 60 are formed to be higher than the cap portion 20 relative to the sensor portion 10. In the present embodiment, by contrast, the bumps 60 are formed to be lower than the cap portion 20.

Figure 20:
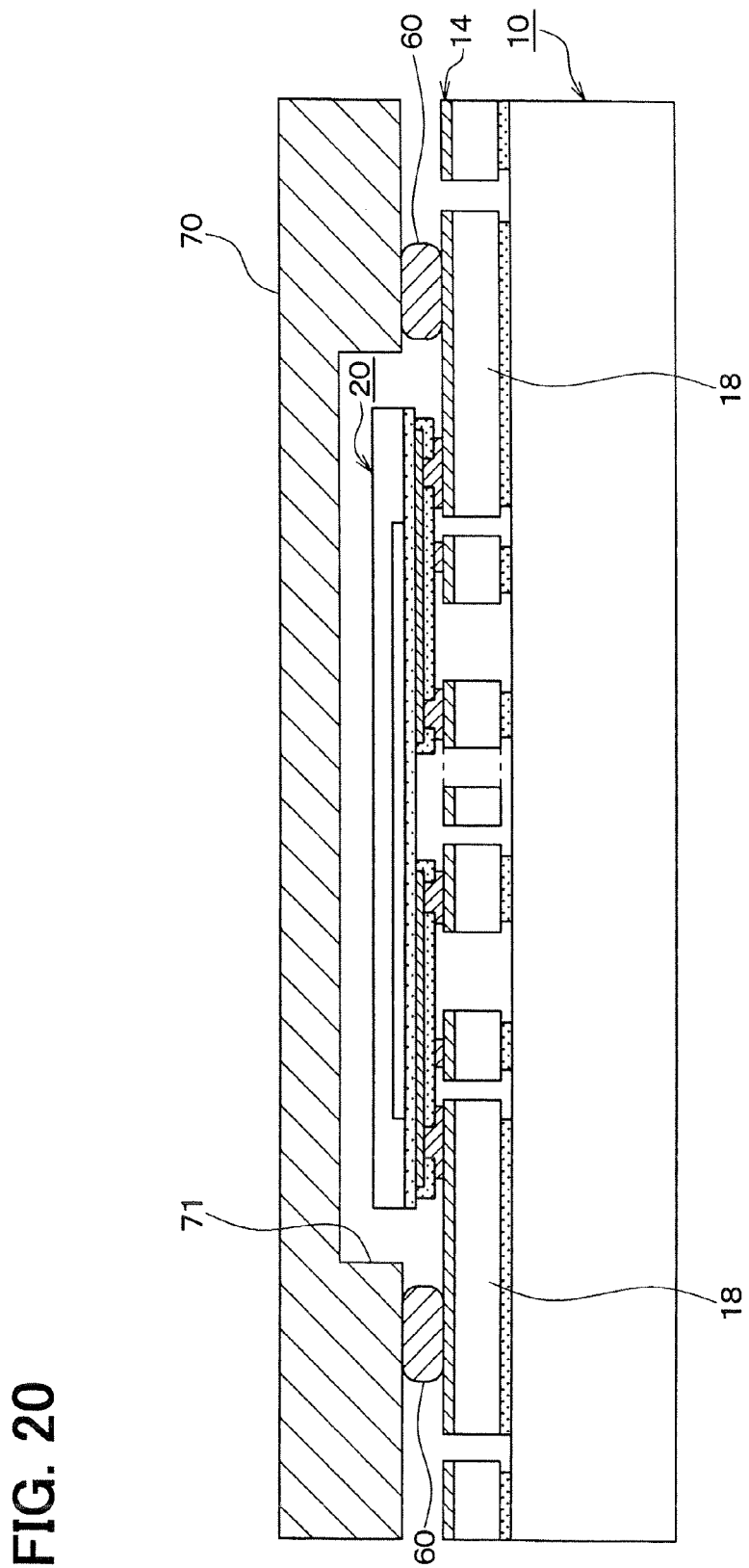
FIG. 20 is a schematic cross-sectional view of a semiconductor dynamic quantity sensor according to a thirteenth embodiment of the present invention.

FIG. 20 is a schematic cross-sectional view of the semiconductor dynamic quantity sensor according to the present embodiment. As shown in the drawing, the bumps 60 are formed to be lower than the cap portion 20 relative to the sensor portion 10. On the other hand, a depressed portion 71 is formed in the surface of the circuit board 70 opposing the cap portion 20. As a result, even when the circuit board 70 is flip-chip mounted on the sensor portion 10, the cap portion 20 is contained in the depressed portion 71 in the circuit board 71. Therefore, the circuit board 70 is mounted on the sensor portion 10 without contacting the cap portion 20.

The depressed portion 71 in the circuit board 70 may also extend through the circuit board 70. In this case, it follows that the opening is provided in the circuit board 70. However, since the cap portion 20 is contained in the opening, the circuit board 70 is kept from contact with the cap portion 20, in the same manner as described above.

Thus, even when the bumps 60 are lower than the cap portion 20 relative to the sensor portion 10, the circuit board 70 can be flip-chip mounted on the sensor portion 10 by providing the depressed portion 71 or the opening in the circuit board 70.

Fourteenth Embodiment

In the present embodiment, a description will be given only of a portion different from the semiconductor device according to each of the embodiments. The present embodiment is characterized in that two chips having respective wiring pattern portions are bonded to compose a semiconductor device.

Figure 21:
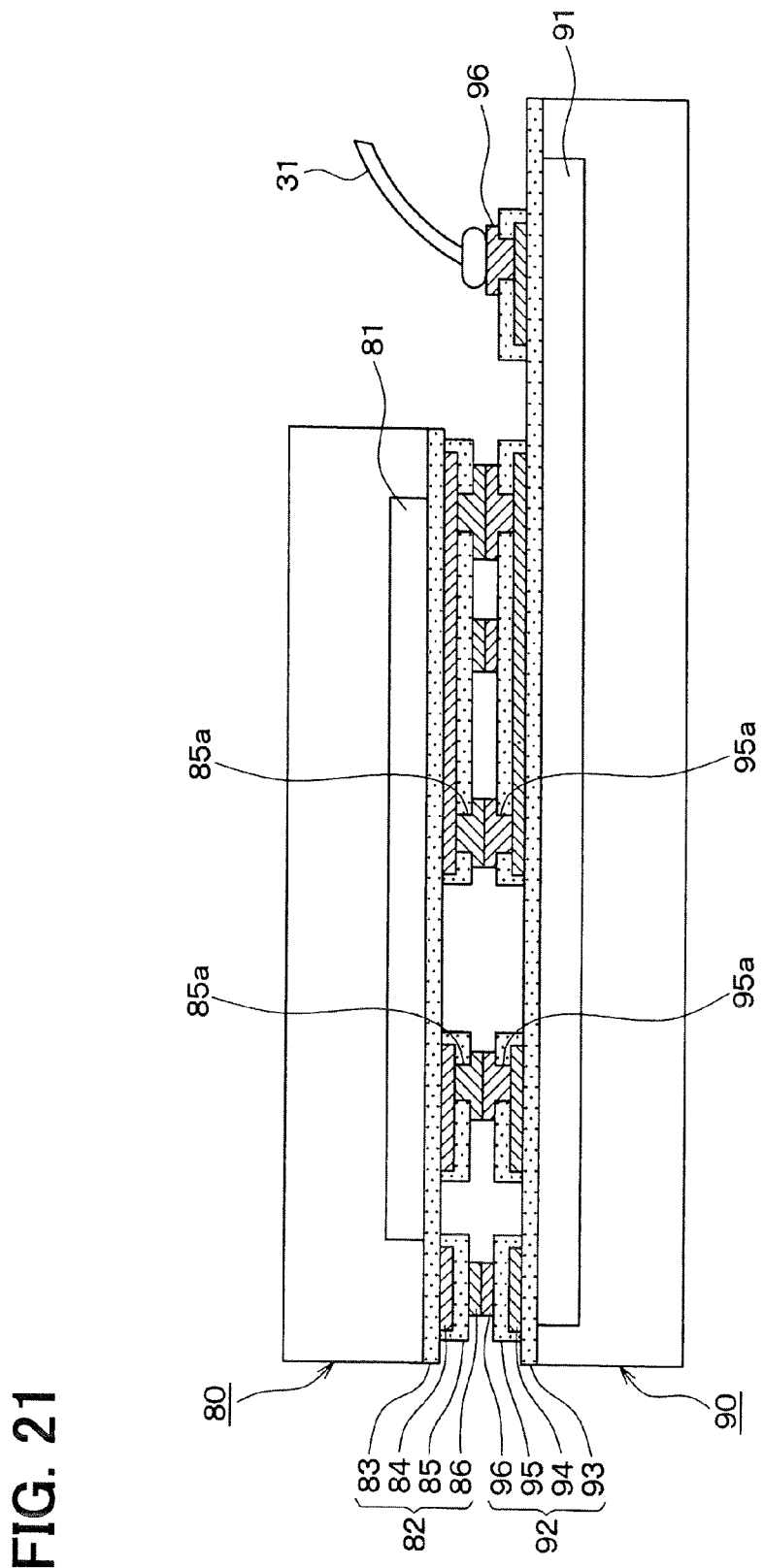
FIG. 21 is a schematic cross-sectional view of a semiconductor device according to a fourteenth embodiment of the present invention.

FIG. 21 is a schematic cross-sectional view of the semiconductor device according to the present embodiment. As shown in the drawing, the semiconductor device comprises a first chip 80 and a second chip 90 bonded to each other.

The first chip 80 has a plate-like shape with a surface, and has a first IC circuit portion 81 provided in the surface layer portion of the surface. The first chip 80 has a wiring pattern portion 82 having the same structure as that of the wiring pattern portion shown in FIG. 2.

Specifically, a first insulating film 83 is formed on the first IC circuit portion 81. On the first insulating film 83, a first wiring layer 84 to be connected to the first IC portion 81 is patterned. In addition, a second insulating film 85 provided with opening parts 85a exposing the first wiring layer 84 is formed on the first wiring layer 84. On the first wiring layer 84 exposed from the opening parts 85a, a second wiring layer 86 is formed. The wiring pattern portion 82 is electrically connected to the first IC circuit portion 81, though not shown in FIG. 21.

Likewise, the second chip 90 has a plate-like shape with a surface, and has a second IC circuit portion 91 provided in the surface layer portion of the surface. The second chip 90 also has a wiring pattern portion 92 having the same structure as that of the wiring pattern portion 82 described above, which is formed on the second IC circuit portion 91.

Specifically, a first insulating film 93 is formed on the second IC circuit portion 91. On the first insulating film 93, a first wiring layer 94 to be connected to the second IC portion 91 is patterned. In addition, a second insulating film 95 provided with opening parts 95a exposing the first wiring layer 94 is formed on the first wiring layer 94. On the first wiring layer 94 exposed from the opening parts 95a, a second wiring layer 96 is formed. It will easily be appreciated that the wiring pattern portion 92 is electrically connected to the second IC circuit portion 91.

The surface of the first chip 80 and the surface of the second chip 90 are oriented to face each other, and the second wiring layer 86 of the wiring pattern portion 82 of the first chip 80 and the second wiring layer 96 of the wiring pattern portion 92 of the second chip 90 are bonded to each other.

The size of the first chip 80 is smaller than the size of the second chip 90 so that the second wiring layer 96 of the second chip 90 is exposed from the first chip 80. To the exposed second wiring layer 96, the bonding wires 31 are connected to electrically connect the semiconductor device and the outside.

Figure 22:
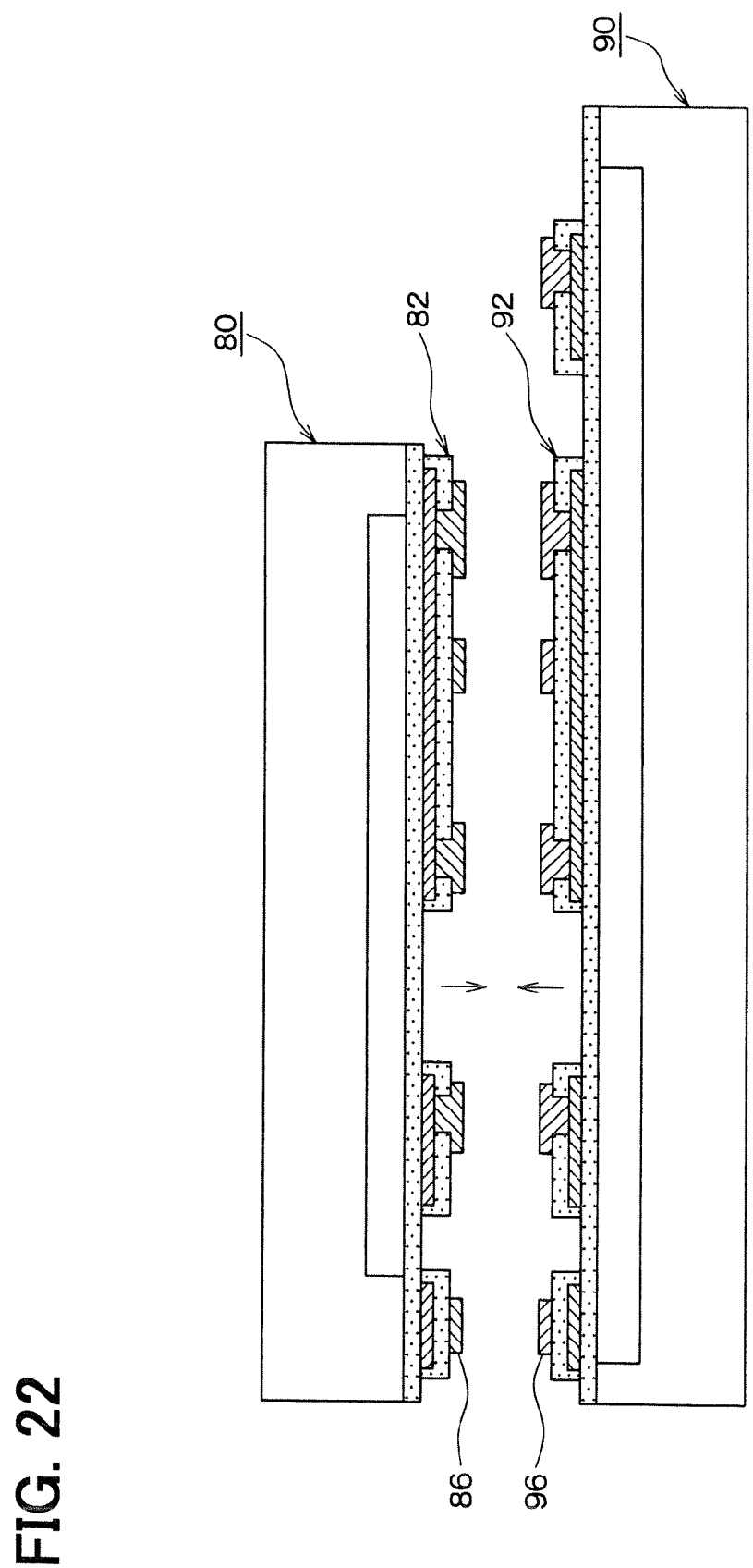
FIG. 22 is a view showing the step of manufacturing the semiconductor device shown in FIG. 21.

The semiconductor device having such a structure is manufactured as follows. As shown in FIG. 22, the first chip 80 formed with the first IC circuit portion 81 and with the wiring pattern portion 82, and the second chip 90 formed with the second IC circuit portion 91 and with the wiring pattern portion 92 are prepared.

In the first chip 80, the height of the second wiring layer 86 is the same relative to the surface of the first chip 80 at any place. Likewise, in the second chip 90, the height of the second wiring layer 96 is also the same relative to the surface of the second chip 90 at any place.

The chips 80 and 90 shown in FIG. 22 are each formed in a wafer state. In a wafer formed with a large number of the first chips 80, through holes are formed in respective portions where the bonding wires are disposed.

Then, the individual wafers are bonded at a room temperature. At this time, the second wiring layer 86 of the wiring pattern portion 82 of the first chip 80 and the second wiring layer 96 of the wiring pattern portion 92 of the second chip 90 are bonded to each other. Thereafter, each of the wafers is cut and divided by dicing, whereby the semiconductor devices each shown in FIG. 21 are completed.

By thus providing the individual chips 80 and 90 with the respective wiring pattern portions 82 and 92, and bonding the individual wiring pattern portions 82 and 92 to each other, each of the semiconductor devices can be formed. In this case, because it is unnecessary to provide a complicated wiring pattern in each of the circuit portions 81 and 91, the area occupied by the circuit portions 81 and 91 can be prevented from increasing, and consequently, the size of each of the chips 80 and 90 can be prevented from increasing. In addition, since the wiring pattern portions 82 and 92 of the individual chips 80 and 90 are merely bonded, the process of manufacturing the semiconductor device can be simplified.

Fifteenth Embodiment

In the present embodiment, a description will be given only of a portion different from the semiconductor device according to the fourteenth embodiment. The present embodiment is characterized in that the wiring pattern portions 82 and 92 are provided with respective hermetically sealing parts.

Figure 23:
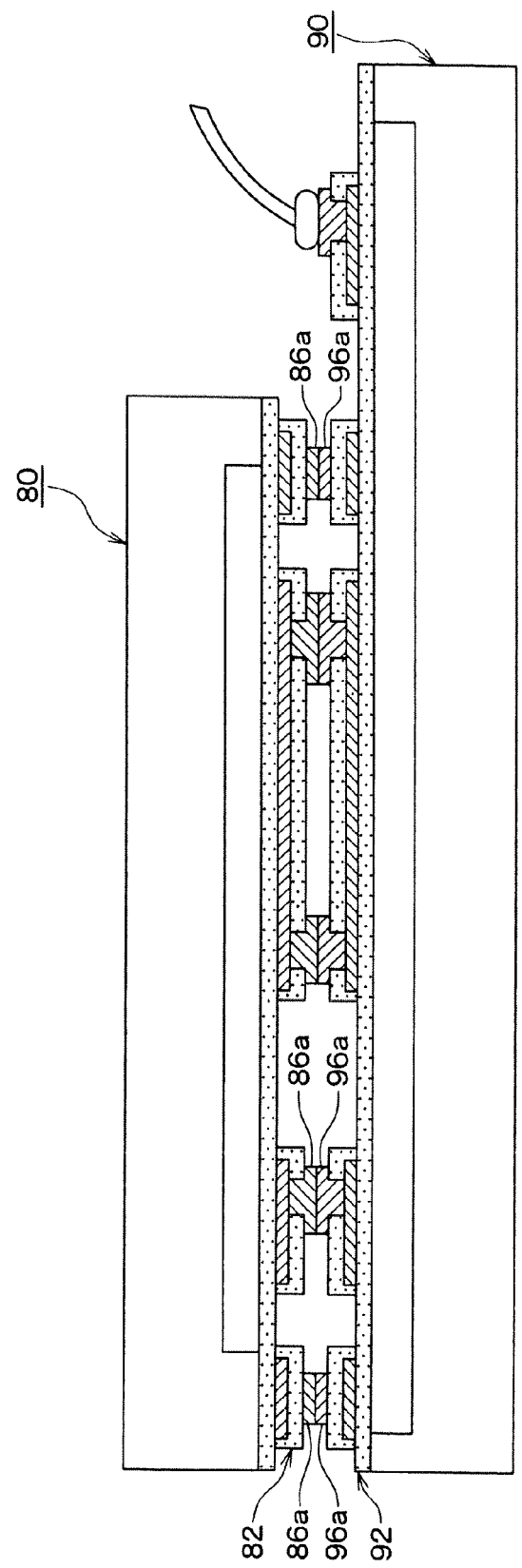
FIG. 23 is a schematic cross-sectional view of a semiconductor device according to a fifteenth embodiment of the present invention.

FIG. 23 is a schematic cross-sectional view of the semiconductor device according to the present embodiment. As shown in the drawing, in the first chip 80, a hermetically sealing part 86a is formed on the second insulating film 85 of the wiring pattern portion 82. As shown in FIG. 3B, the hermetically sealing part 86a is in an annular shape having one end connected to the other end thereof. The hermetically sealing part 86a is formed on the second insulating film 85 to be electrically insulated from the first wiring layer 84 and have the same height as that of the second wiring layer 86.

Likewise, in the second chip 90, a hermetically sealing part 96a, which is the same as the hermetically sealing part 86a described above, is also formed on the second insulating film 95.

The individual second wiring layers 86 and 96 are bonded, and the individual hermetically sealing parts 86a and 96a are bonded to hermetically seal the space defined by the hermetically sealing parts 86a and 96a, the first insulating film 83 and 93, and the second insulating films 85 and 95.

By thus providing the individual wiring pattern portions 82 and 92 with the annular hermetically sealing parts 86a and 96a having the same heights as those of the second wiring layers 86 and 96, the entrance of water vapor, moisture, ions, and the like from the outside can be prevented, and the hermetically sealed space can be protected from contamination from the outside.

Because the hermetically sealed space is immune to influence from the outside, e.g., the influence of a temperature or the like, it is possible to prevent variations in the characteristics of the individual circuit portions 81 and 91.

Sixteenth Embodiment

In the present embodiment, a description will be given only of a portion different from the semiconductor device according to each of the embodiments. In each of the embodiments described above, the semiconductor dynamic quantity sensor or semiconductor device which detects an acceleration in a direction parallel with the surface of the sensor portion 10 is shown by way of example. In the present embodiment, by contrast, a description will be given of a semiconductor dynamic quantity sensor which detects an acceleration in a direction perpendicular to the surface of the sensor portion 10.

Figure 24:
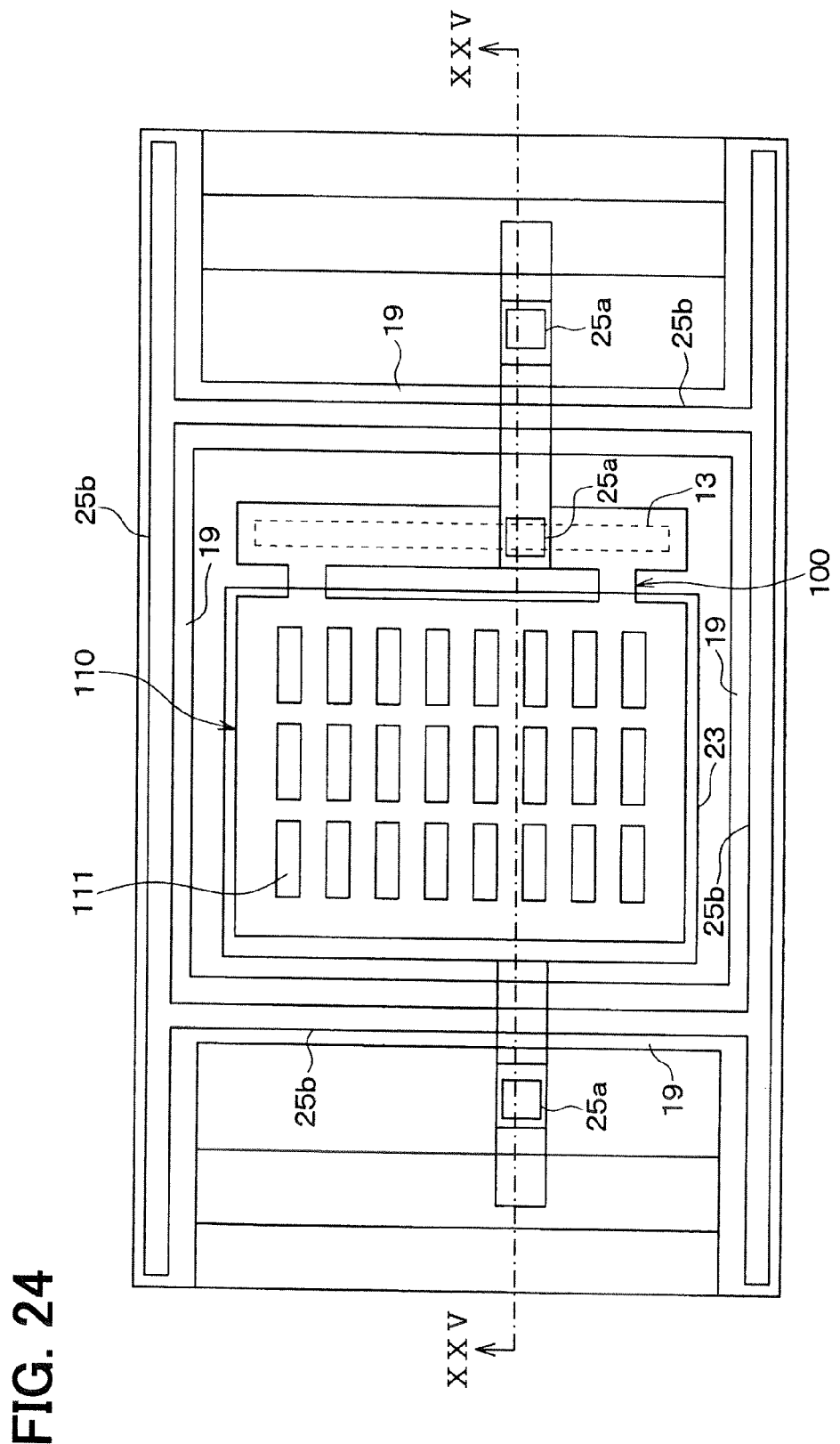
FIG. 24 is a plan view of a semiconductor dynamic quantity sensor according to a sixteenth embodiment of the present invention.
Figure 25:
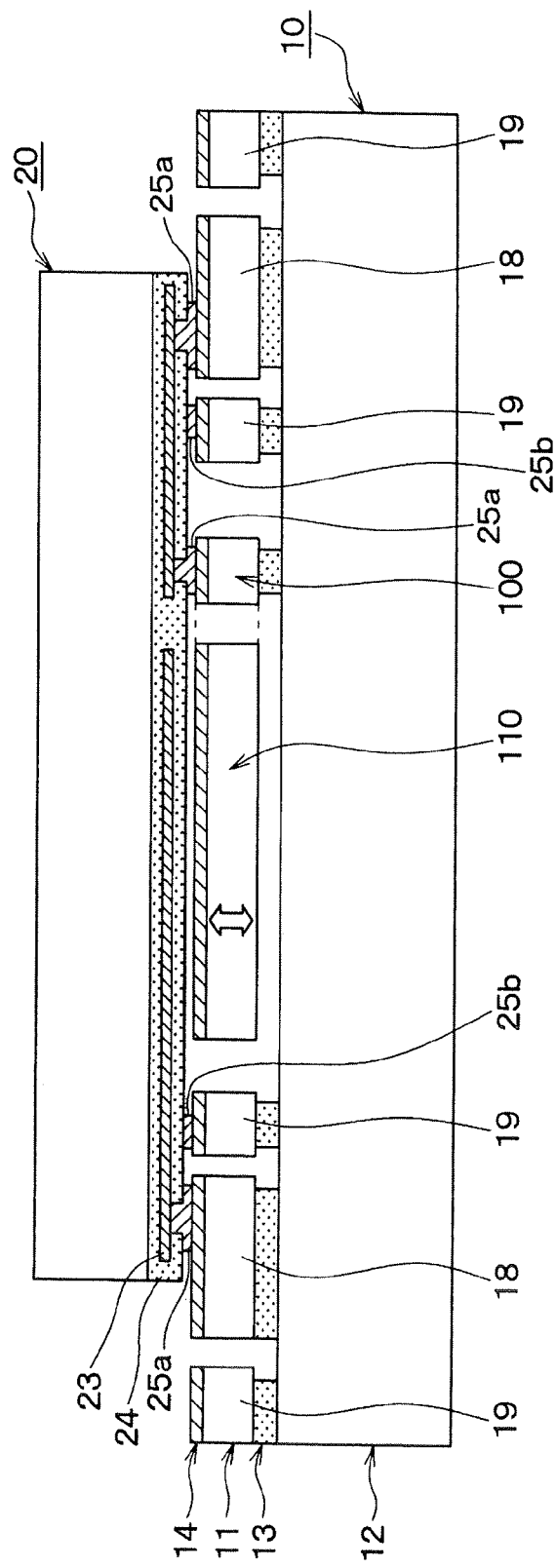
FIG. 25 is a cross-sectional view along the line XXV-XXV of FIG. 24.

FIG. 24 is a plan view of the semiconductor dynamic quantity sensor according to the present embodiment. FIG. 25 is a cross-sectional view along the line XXV-XXV of FIG. 24. Although the sensor portion 10 is primarily shown in the plan view of FIG. 24, a part of the first wiring layer 23 of the cap portion 20 is also shown therein.

As shown in FIG. 24, beam portions 100 and a movable electrode 110 are provided in the region of the sensor portion 10 encircled by the peripheral portion 19. As shown in FIG. 25, each of the beam portions 100 is formed on the insulating layer 13 made of $SiO_2$ or the like. The movable portion 110 is formed by etching a part of the first silicon layer 11 into the plate-like shape shown in FIG. 24. The movable electrode 110 has a side surface thereof connected to the beam portions 100. The movable electrode 110 is provided with a large number of through holes 111. On the movable electrode 110, the wiring layer 14 is left.

The insulating layer 13 between the movable electrode 110 and the second silicon layer 12 is removed so that the movable electrode 110 is in a state floating over the second silicon layer 12. That is, a lower gap of a height corresponding to the thickness of the insulating layer 13 between the movable electrode 110 and the second silicon layer 12 is formed under the movable electrode 110. On the other hand, an upper gap of a height corresponding to the thickness of the second wiring layer 25 is formed between the wiring layer 14 on the movable electrode 110 and the second insulating film 24 of the cap portion 24. As a result, the movable electrode 110 serves as a spindle which can move in the direction indicated by the arrow shown in FIG. 25, i.e., in the direction perpendicular to the surface of the sensor portion 10. The direction perpendicular to the surface of the sensor portion 10 will be hereinafter referred to as a Z-axis.

The beam portions 100 and the movable electrode 110 are encircled by the hermetically sealing part 25b bonded to the peripheral portion 19, and disposed in the sealed space.

In addition, the cap portion 20 has the first wiring layer 23 formed at a position which opposes the movable electrode 110 when the cap portion 20 and the sensor portion 10 are bonded to each other. The first wiring layer 23 is sandwiched between the first insulating film 22 and the second insulating film 24. A capacitor is formed using the first wiring layer 23 as an upper electrode (fixed electrode) and using the movable electrode 110 as a lower electrode.

In such a semiconductor device, when the movable electrode 110 vibrates in the Z-axis direction, a change in the distance between the first wiring layer 23 and the movable electrode 110 is detected. More specifically, a change in the distance between the wiring layer 14 on the movable electrode 110 and the first wiring layer 23 is detected. That is, an acceleration in the Z-axis direction is obtained by detecting the capacitance of the capacitor which varies with the change in the distance.

The movable electrode 110 can be formed by, e.g., the same manufacturing method as that for the movable electrode portion 16 shown in FIG. 1. The present embodiment shows the beam portions 100 each formed to have the same thickness as that of the first silicon layer 11 of the SOI substrate. However, it is also possible to reduce the thickness of each of the beam portions 100 as necessary. In that case, it is important to accurately form the gap for the detection of the capacitance in the Z-axis direction between the movable electrode 110 and the first wiring layer 23 with no fluctuation. The present embodiment uses a CVD multilayer deposition method, a sputtering method, or the like which allows the formation of the beam portions 100 each having an accurate thickness.

As described above, a part of the first wiring layer 23 of the cap portion 20 can be used as the fixed electrode of a sensor for detecting an acceleration, and the acceleration in the Z-axis direction can be detected. In addition, the beam portions 100 and the movable electrode 110 can be hermetically sealed by the hermetically sealing part 25b. This can prevent the movable electrode 110 from receiving influence from the outside and improve the accuracy of acceleration detection.

Seventeenth Embodiment

Figure 26:
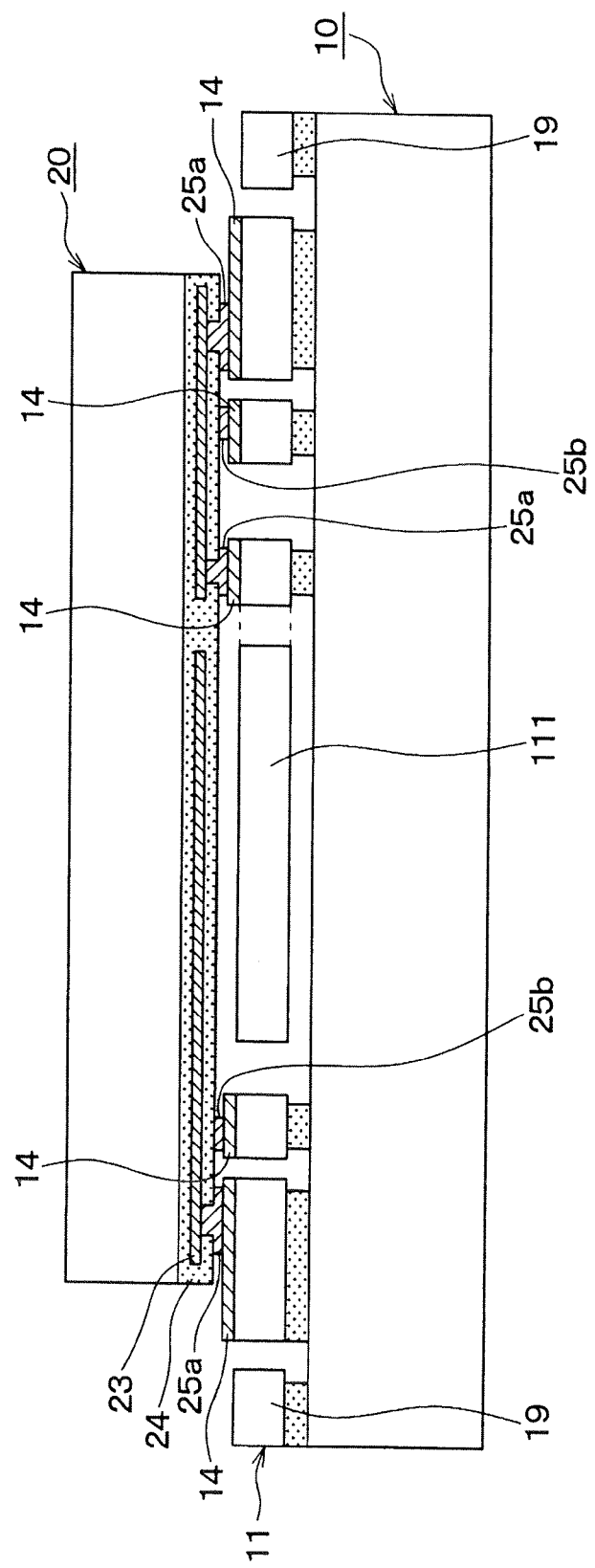
FIG. 26 is a schematic cross-sectional view of a semiconductor dynamic quantity sensor according to a seventeenth embodiment of the present invention.

In the present embodiment, a description will be given only of a portion different from the semiconductor device according to the sixteenth embodiment. FIG. 26 is a schematic cross-sectional view of the semiconductor dynamic quantity sensor according to the present embodiment. As shown in the drawing, the wiring layer 14 is removed from above the movable electrode 110 in the present embodiment. As a result, the upper gap of a height corresponding to the combined thickness of the second wiring layer 25 and the wiring layer 14 removed from above the movable electrode 110 is formed. Accordingly, the gap between the second insulating film 24 and the movable electrode 110 is vertically wider than in the case where the wiring layer 14 is formed on the movable electrode 110. As a result, it is possible to prevent the movable electrode 110 moving in the Z-axis direction from contacting the second insulating film 24.

In addition, the wiring layer 14 is also removed from above the peripheral portion 19. Thus, the portion of the wiring layer 14 which is not bonded to the cap portion 20 is removed from the first silicon layer 11. In other words, only the portion of the wiring layer 14 which is bonded to the wiring part 25a and the hermetically sealing part 25b of the second wiring layer 25 of the cap portion 20 is provided on the first silicon layer 11.

By thus forming the wiring layer 14 only in the area of the first silicon layer 11 needed for the bonding of the sensor portion 10 and the cap portion 20, the influence of the difference in thermal expansion coefficient between silicon and metal can be reduced.

Eighteenth Embodiment

Figure 27:
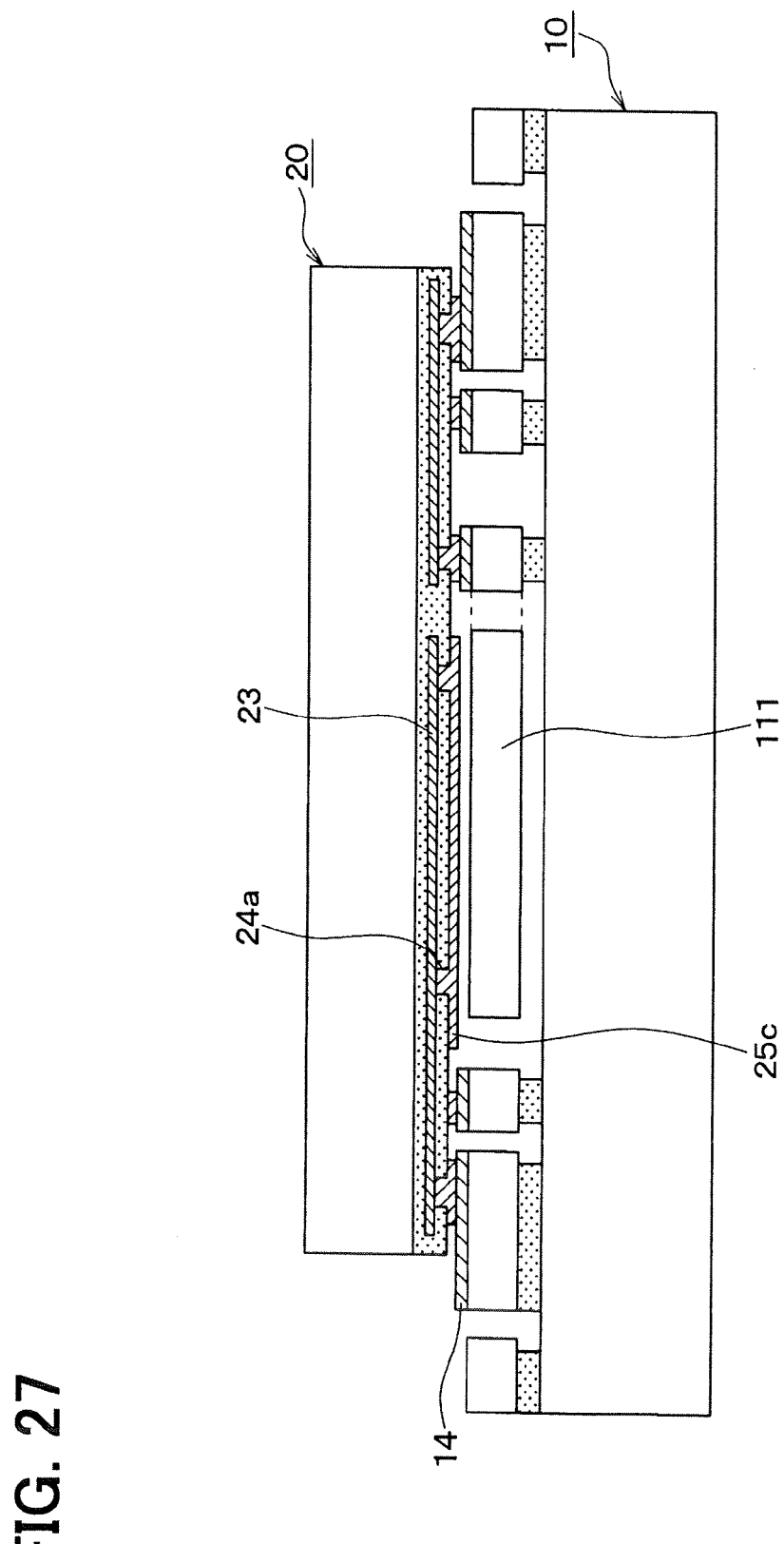
FIG. 27 is a schematic cross-sectional view of a semiconductor dynamic quantity sensor according to an eighteenth embodiment of the present invention.

In the present embodiment, a description will be given only of a portion different from the semiconductor device according to the seventeenth embodiment. FIG. 27 is a schematic cross-sectional view of the semiconductor dynamic quantity sensor according to the present embodiment. As shown in the drawing, in the present embodiment, a counter electrode 25c is formed in the area of the second insulating film 24 opposing the movable electrode 110. The counter electrode 25c is formed as the second wiring layer 25 on the second insulating film 24, simultaneously with the wiring part 25a. The counter electrode 25c is electrically connected to the first wiring layer 23 via the opening parts 24a provided in the second insulating film 24.

The counter electrode 25c is formed of, e.g., Al or polysilicon. The wiring layer 14 is also formed of Al or polysilicon.

In the present embodiment, the wiring layer 14 is removed from the movable electrode 100 so that the upper gap of a height corresponding to the thickness of the wiring layer 14 removed from the movable electrode 110 is formed. The acceleration in the Z-axis direction is detected by detecting a change in the distance between the movable electrode 110 and the counter electrode 25c.

Thus, by providing the counter electrode 25c on the second insulating film 24, the distance between the movable electrode 110 and the counter electrode 25c can be reduced to a value smaller than in the case where the first wiring layer 23 is used as the fixed electrode. Accordingly, the output range of a detected value can be widened.

Nineteenth Embodiment

Figure 28A:
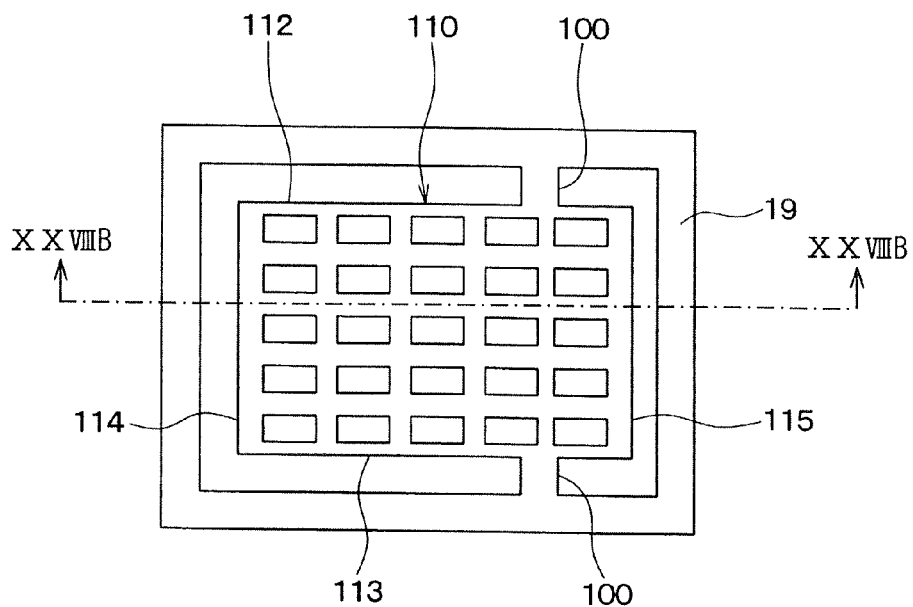
FIG. 28A is a schematic plan view of a semiconductor dynamic quantity sensor according to a nineteenth embodiment of the present invention.
Figure 28B:
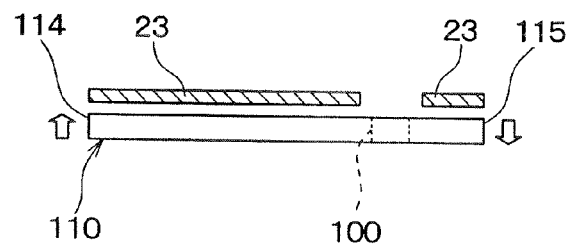
FIG. 28B is a cross-sectional view along the line XXVIIIB-XXVIIIB of FIG. 28A.

In the present embodiment, a description will be given only of a portion different from the semiconductor device according to the eighteenth embodiment. FIG. 28A is a schematic plan view of the semiconductor dynamic quantity sensor according to the present embodiment. FIG. 28B is a cross-sectional view along the line C-C of FIG. 28A. In FIGS. 28A and 28B, only the peripheral portion 19 and the movable electrode 110 are shown, and the other members are omitted.

As shown in FIG. 28A, in the present embodiment, the beam portions 100 are provided at two places which are a side surface 112 of the movable electrode 110 and a side surface 113 thereof opposite to the side surface 112. The individual beam portions 100 connect the peripheral portion 19 and the movable electrode 110 to be located on mutually opposite sides. As a result, as shown in FIG. 28B, the side surface 114 of the movable electrode 110, which is among the two side surfaces 114 and 115 each perpendicular to the side surfaces 112 and 113 of the movable electrode 110, and more distant from the beam portions 100 than the side surface 115, greatly moves, while the side surface 115 closer to the beam portions 110 moves less greatly than the side surface 114. In this case, the beam portions are twisted in the direction of the movement.

As shown in FIG. 28B, the cap portion 20 has the first wiring layer 23 as the fixed electrode, which is divided and provided in the respective areas of the movable electrode 110 opposing the side surface 114 and the side surface 115.

As a result, when the movable electrode 110 moves in the Z-axis direction, the side thereof adjacent the side surface 114 moves closer to the first wiring layer 23, while the side of the movable electrode 110 adjacent the side surface 115 moves away from the first wiring layer 23. Conversely, when the side of the movable electrode 110 adjacent the side surface 114 moves away from the first wiring layer 23, the side of the movable electrode 110 adjacent the side surface 115 moves closer to the first wiring layer 23. By detecting a change in the capacitance between the movable electrode 110 which moves and the first wiring layer 23, the acceleration in the Z-axis direction can be detected.

In the case shown in FIG. 28, the wiring layer 14 is not provided in the movable electrode 110. However, it will easily be appreciated that the wiring layer 14 may also be provided therein. As shown in FIG. 27, the counter electrode 25c may also be divided and provided on the respective sides of the movable electrode 110 adjacent the side surface 114 and the side surface 115 in the cap portion 20.

As described above, it is also possible to detect the acceleration in the Z-axis direction by providing the two side surfaces 112 and 113 of the movable electrode 110 with the beam portions 100 connected to the movable electrode 110.

Twentieth Embodiment

Figure 29A:
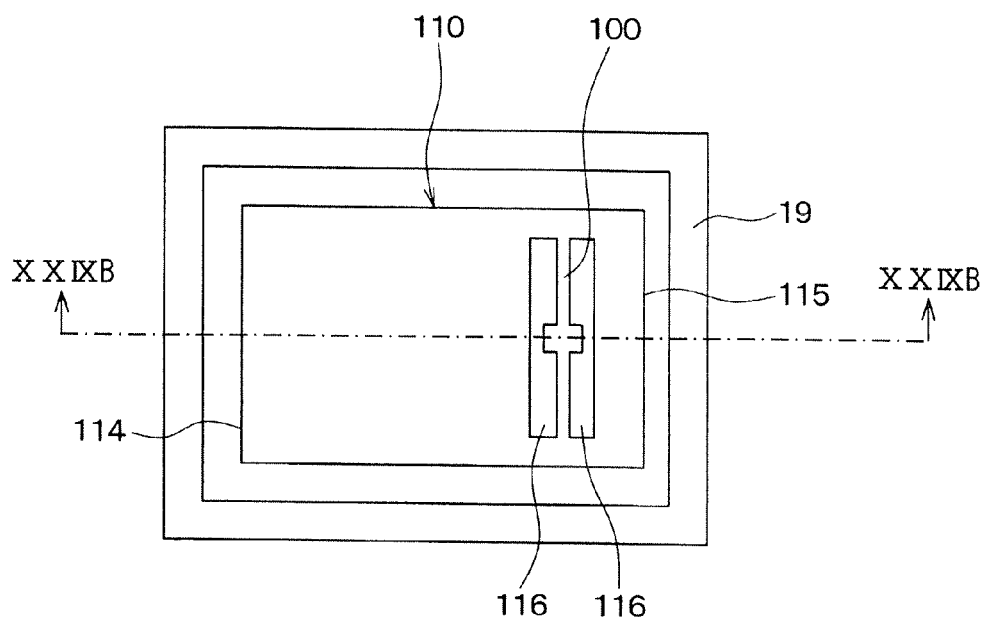
FIG. 29A is a schematic plan view of a semiconductor dynamic quantity sensor according to a twentieth embodiment of the present invention.
Figure 29B:
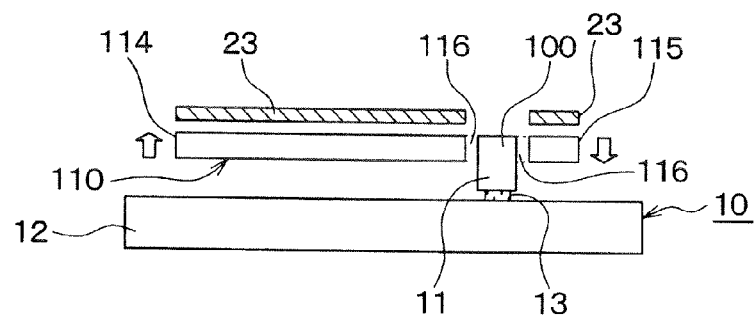
FIG. 29B is a cross-sectional view along the line XXIX-XXIX of FIG. 29A.

In the present embodiment, a description will be given only of a portion different from the semiconductor device according to the eighteenth embodiment. FIG. 29A is a schematic plan view of the semiconductor dynamic quantity sensor according to the present embodiment. FIG. 29B is a cross-sectional view along the line D-D of FIG. 29A. In FIGS. 29A and 29B, only the peripheral portion 19 and the movable electrode 110 are shown, and the other members are omitted.

As shown in FIG. 29A, two through holes 116 are provided on the side of the movable electrode 110 adjacent the side surface 115 to be arranged in the direction perpendicular to the side surface 115. The portion interposed between the through holes 116 serves as the beam portion 110. The beam portion 110 is a part of the first silicon layer 11, and fixed to the second silicon layer 12 via the insulating layer 13. Accordingly, by the twisting of the beam portion 100, the respective sides of the movable electrode 110 adjacent the side surfaces 114 and 115 are allowed to move in the Z-axis direction.

Therefore, in the same manner as in the nineteenth embodiment, the acceleration in the Z-axis direction is detected by detecting a change in the distance between the first wiring layer 23 and the side of the movable electrode 110 adjacent the side surface 114 as well as a change in the distance between the first wiring layer 23 and the side thereof adjacent the side surface 115.

As shown in FIG. 24, it is also possible to provide a large number of the through holes 111 in the movable electrode 110. It is also possible to detect a change in the distance between the counter electrode 25c shown in FIG. 27 and each of the sides adjacent the side surfaces 114 and 115, not between the first wiring layer 23 and each of the sides adjacent the side surfaces 114 and 115.

Thus, by providing the structure in which the beam portion 110 is disposed within the range of the movable electrode 110 and twisted, the acceleration in the Z-axis direction can be detected.

Other Embodiments

In each of the embodiments described above, the semiconductor device provided with the hermetically sealing part 25b is shown. However, the hermetically sealing part 25b functions to hermetically seal the sensor structures 15 to 17, and need not necessarily be provided in the semiconductor device. In other words, the semiconductor device may also have a structure which is not provided with the hermetically sealing part 25b.

In each of the embodiments described above, N-type monocrystalline silicon is used for each of the silicon layers 11 and 12 of the sensor portion 10. However, it is also possible to use, e.g., an $N^+$-type monocrystalline silicon. Although the silicon substrate 21 and the silicon layers 11 and 12 that have been used heretofore are each at a high concentration, it is also possible to use a substrate and layers obtained by implanting impurity ions into a low-concentration substrate and low-concentration layers, or a substrate and layers each obtained by increasing the concentration of the entire part or only a surface thereof by a vapor-phase impurity diffusion method or the like.

In each of the embodiments described above, the silicon substrate 21 is used for the cap portion 20. However, it is also possible to use an insulating material such as, e.g., glass. This obviates the necessity for the first insulating film 22, and allows the first wiring layer 23 to be formed directly on the insulating material.

The first wiring layer 23 can also be formed of doped polysilicon. Further, it is also possible to use doped polysilicon for the second wiring layer 25. In the case of using polysilicon, a silicon-silicon junction is formed by room-temperature bonding so that the mechanical strength and stability are improved. In this case, Al layers may be formed only on the bonding pad portions for wire bonding. For more simplification, it is possible to form an Al, Au, or Cu printed layer on the bonding pad portions by an ink jet method, a screen printing method, or the like, and perform a thermal process as necessary to increase adhesion, and perform wire bonding with respect to the regions.

In the twelfth embodiment, the bumps 60 are provided in the sensor portion 10. However, it is also possible to perform flip-chip mounting (ball bonding) with respect to the cap portion 20. In this case, a stress placed on the sensor portion 10 from the outside can further be reduced.

In the twelfth and thirteenth embodiments, the IC circuit portion 50 is provided on the side of the cap portion 20 facing the sensor portion 10. However, it is also possible to provide the IC circuit portion 50 on the side opposite to the side of the cap portion 20 to be bonded to the sensor portion 10, i.e., on the side with the circuit board 70.

In the fourteenth and fifteenth embodiments, the chips 80 and 90 are shown which have the respective circuit portions 81 and 91 formed only in the surface layer portions of the surfaces thereof. However, they are only illustrative, and the circuit portions may also be provided in the surface layer portions of the surfaces opposite to the foregoing surfaces. In this case, the respective circuit portions provided on the both surfaces may be connected appropriately by through electrodes extending through the chips 80 and 90.

The movable electrode 110 which moves in the Z-axis direction shown in each of the sixteenth to twentieth embodiments can be used not only in the acceleration sensor, but also as the drive electrode of a Gyro sensor (in this case, the detection electrode serves as an electrode movable in parallel with a substrate in a comb-teeth shape), or as the detection electrode of the Gyro sensor (in this case, the movable electrode 110 serves as the electrode movable in parallel with the substrate in a comb-teeth shape).

In the embodiments described above, the individual acceleration sensors each for detecting the acceleration in the Z-axis direction or in the direction perpendicular to the Z-axis direction have been described. However, it is also possible to produce a biaxial acceleration sensor in which an acceleration sensor for detecting the acceleration in the Z-axis direction and an acceleration sensor for detecting the acceleration in the direction perpendicular to the Z-axis direction are integrated on a single chip. Likewise, it is also possible to integrate sensors capable of respectively detecting accelerations along the Z-axis, along the X-axis, and along a Y-axis perpendicular to the X-axis and the Z-axis on a single chip. In this case, each of the acceleration sensors for detecting the accelerations in the individual axis directions can be individually encircled by the hermetically sealing part 25b, or all the acceleration sensors can also be encircled by a single hermetically sealing part 25b.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a sensor element having a plate shape with a surface and including a sensor structure disposed in a surface portion of the sensor element, a peripheral portion, which surrounds the sensor structure, and a connection portion for connecting to an external element; and
   a plate-shaped cap element bonded to the surface of the sensor element, wherein:
   the cap element has a silicon substrate, a first insulation film on the silicon substrate, a first conduction contact portion and a wiring pattern portion facing the sensor element;
   the wiring pattern portion includes:
      a first wiring layer disposed on the first insulation film;
      a second insulation film disposed on the first wiring layer;
      a second wiring layer disposed on the second insulation film; and
      a second conduction contact portion;
   the first insulation film has a first opening for exposing the silicon substrate via the first opening;
   the first conduction contact portion is disposed in the first opening, and electrically connects the silicon substrate and the first wiring layer;
   the second wiring layer includes a wiring part, which is disposed on the first wiring layer exposed from the second insulation film, and a hermetically sealing part, which has a ring shape and faces the peripheral portion;
   the second insulation film has a second opening so that the first wiring layer is exposed from the second insulation film in the second opening;
   the second conduction contact portion is disposed in the second opening;
   the second conduction contact portion electrically connects the first wiring layer and the hermetically sealing part so that the silicon substrate is electrically coupled with the peripheral portion via the first conduction contact portion, the first wiring layer, the second conduction contact portion and the hermetically sealing part;
   the hermetically sealing part is bonded to the peripheral portion so that the sensor structure is sealed and accommodated in a space defined by the cap element and the sensor element;
   the wiring part is coupled with the sensor structure;
   the connection portion is disposed on an outside of the space; and
   the wiring part is further coupled with the connection portion so that the sensor structure is coupled with the external element via the connection portion and the wiring part.

2. The semiconductor device of claim 1, wherein:
   the cap element further includes an IC circuit portion, which is disposed in a surface portion of the cap element and opposite to the sensor element.

3. The semiconductor device of claim 1, wherein:
   the cap element further includes an IC circuit portion, which is disposed in a surface portion of the cap element and faces the sensor element.

4. The semiconductor device of claim 1, wherein:
   the cap element further includes a recessed part, which faces at least the sensor structure, and is not disposed on the wiring part.

5. The semiconductor device of claim 1 wherein:
   the sensor element has an SOI substrate comprising a first silicon layer, a second silicon layer and an insulation layer;
   the sensor structure is disposed in the first silicon layer;
   the insulation layer is sandwiched between the first silicon layer and the second silicon layer;
   the peripheral portion is disposed in the first silicon layer;
   the insulation layer has a third opening, in which a substrate contact part is disposed; and
   the substrate contact part is disposed between the peripheral portion and the second silicon layer to electrically connect the peripheral portion and the second silicon layer.

6. The semiconductor device of claim 1, wherein:
   the sensor element has a third wiring layer on the surface portion of the sensor element; and
   the cap element is bonded to the third wiring layer.

7. The semiconductor device of claim 1, wherein:
   the sensor structure includes a movable electrode movable within the sensor element;
   the first wiring layer faces the movable electrode; and
   the sensor element detects distance change between the first wiring layer and the movable electrode so that the sensor element detects a physical quantity in a direction perpendicular to the surface of the sensor element.

8. The semiconductor device of claim 1, wherein:
   the sensor structure includes a movable electrode movable within the sensor element;
   the wiring pattern portion further includes a counter electrode;
   the counter electrode is disposed on the second insulation film, and faces the movable electrode; and
   the sensor element detects distance change between the movable electrode and the counter electrode, which corresponds to the distance change between the second wiring layer and the movable electrode.

* * * * *